US012757406B2

(12) United States Patent
Huang et al.

(10) Patent No.: US 12,757,406 B2
(45) Date of Patent: Oct. 6, 2026

(54) MEMORY STRUCTURE AND METHOD OF FORMING THE SAME

(71) Applicant: Taiwan Semiconductor Manufacturing Company, Ltd., Hsinchu (TW)

(72) Inventors: Chien Ta Huang, Hsinchu (TW); Chia Chi Fan, Hsinchu (TW); Chun-Yang Tsai, Hsinchu City (TW); Kuo-Ching Huang, Hsinchu City (TW); Harry-Haklay Chuang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 580 days.

(21) Appl. No.: 17/751,363

(22) Filed: May 23, 2022

(65) Prior Publication Data

US 2023/0292525 A1 Sep. 14, 2023

Related U.S. Application Data

(60) Provisional application No. 63/319,085, filed on Mar. 11, 2022.

(51) Int. Cl.
*H10B 53/30* (2023.01)

(52) U.S. Cl.
CPC .................................... *H10B 53/30* (2023.02)

(58) Field of Classification Search
CPC ....................................................... H10B 53/30
See application file for complete search history.

(56) References Cited

U.S. PATENT DOCUMENTS

2010/0264123 A1 10/2010 Jennings et al.
2015/0364536 A1* 12/2015 Bibes .................... H10N 70/20 257/421
2016/0268499 A1 9/2016 You
2019/0115353 A1* 4/2019 O'Brien ................ H10B 51/30
(Continued)

FOREIGN PATENT DOCUMENTS

CN 1545734 A 11/2004
CN 110970438 A 4/2020
(Continued)

OTHER PUBLICATIONS ip.com search (Year: 2026).*
(Continued)

*Primary Examiner* — Zandra V Smith
*Assistant Examiner* — Andre C Stevenson
(74) *Attorney, Agent, or Firm* — HAYNES AND BOONE, LLP

(57) ABSTRACT

A device structure according to the present disclosure includes a conductive feature disposed in a first dielectric layer, a ferroelectric tunnel junction (FTJ) stack disposed over the conductive feature, a spacer disposed along sidewalls of the FTJ stack, a second dielectric layer disposed over the spacer and the FTJ stack, and a contact via extending through the second dielectric layer. The FTJ stack includes a bottom electrode layer electrically coupled to the conductive feature, a ferroelectric layer over the bottom electrode layer, and a top electrode layer on the ferroelectric layer. The top electrode layer is formed of a conductive metal oxide.

20 Claims, 22 Drawing Sheets

(56) References Cited

U.S. PATENT DOCUMENTS

| | | | | |
|---|---|---|---|---|
| 2020/0105772 | A1* | 4/2020 | Chen | H10B 53/30 |
| 2020/0194442 | A1 | 6/2020 | Grenouillet | |
| 2021/0098685 | A1 | 4/2021 | Liou | |
| 2021/0375991 | A1 | 12/2021 | Ho | |
| 2021/0398990 | A1 | 12/2021 | Chia | |
| 2021/0398991 | A1 | 12/2021 | Manfrini | |
| 2021/0408013 | A1 | 12/2021 | Young | |

FOREIGN PATENT DOCUMENTS

| | | | |
|---|---|---|---|
| CN | 113421895 | A | 9/2021 |
| JP | 2003298021 | A | 10/2003 |
| JP | 2004214544 | A | 7/2004 |
| JP | 2008010836 | A | 1/2008 |
| JP | 2008135619 | A | 6/2008 |
| JP | 2015065251 | A | 4/2015 |
| JP | 2020113604 | A | 7/2020 |
| WO | 2007116440 | A1 | 10/2007 |

OTHER PUBLICATIONS

Koren search history (Year: 2026).*
Japanese search history (Year: 2026).*
Veeresh Deshpande et al., CMOS back-end-of-line compatible ferroelectric tunnel junction devices, Solid State Electronics 186 (2021) 108054, 4 pages.

* cited by examiner

MEMORY STRUCTURE AND METHOD OF FORMING THE SAME

PRIORITY DATA

This application claims the benefit of U.S. Provisional Application No. 63/319,085, filed Mar. 11, 2022, which is hereby incorporated by reference in its entirety.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

The scaling down process has prompted circuit designers to move devices from the front-end-of-line (FEOL) level to the back-end-of-line (BEOL) level where the interconnect structure resides. For example, ferroelectric-based memory devices may be formed at the BEOL level. Forming ferroelectric-based memory devices at the BEOL level is not without challenges. While existing processes and structures of dielectric-based memory devices are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
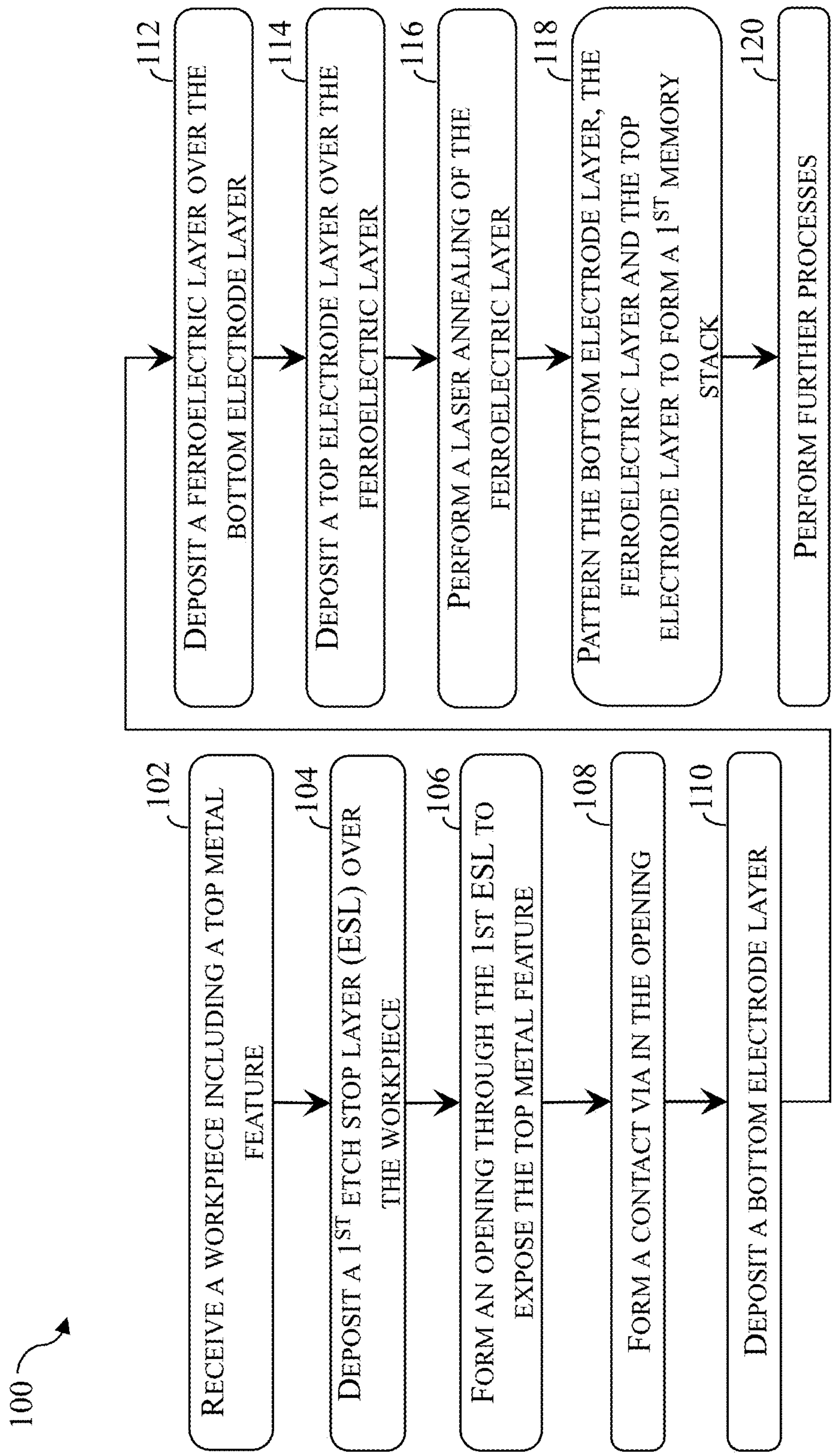
FIG. 1 is a flow chart illustrating an example method 100 of forming a device structure according to various aspects of the present disclosure.

The present disclosure relates generally to integrated circuit devices, and more particularly, to interconnect structures for integrated circuit devices.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with “about,” “approximate,” and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of “about 5 nm” can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

IC manufacturing process flow is typically divided into three categories: front-end-of-line (FEOL) processes, middle-end-of-line (MEOL) process, and back-end-of-line (BEOL) processes. FEOL processes generally encompass processes related to fabricating IC devices, such as transistors. For example, FEOL processes can include forming isolation features, channel features, gate structures, and source and drain features (generally referred to as source/drain features). MEOL processes generally encompass processes related to fabricating contacts to multi-gate devices, such as fin-type field effect transistors (FinFETs) or gate-all-around (GAA) transistors (also known as multi-bridge-channel (MBC) transistors or surrounding gate transistors (SGTs)). Example MEOL features include contacts to the gate structures and/or the source/drain features of a multi-gate transistor. BEOL processes generally encompass processes related to fabricating a multilayer interconnect (MLI) feature that interconnects FEOL IC features, thereby enabling operation of the IC devices. To save real estate at the FEOL level, larger devices that do not require the level of photolithographic precisions for transistors may be moved to FEOL structures. For example, ferroelectric-based memory devices, such as ferroelectric tunnel junction (FTJ) memory devices, may be fabricated at the BEOL level.

An FTJ memory is non-volatile memory that includes two electrodes sandwiching a ferroelectric tunnel barrier. While an FTJ memory shares some similar attributes with a ferroelectric random access memory (FeRAM), they are different in many aspects. In an FeRAM, a thick ferroelectric film is sandwiched between two electrodes and the remnant polarization is switched by applying an electric field between the two electrodes. However, the capacitive readout of the remnant polarization may disrupt the polarization and requires rewriting of information. Additionally, the readout current across the thick ferroelectric film tends to be low, which creates challenges for miniaturization or integration into the BEOL structures. As compared to an FeRAM, an FTJ memory includes a thin ferroelectric layer (measured in nanometers) which allows quantum-mechanical tunneling. The quantum-mechanical tunneling gives rise to tunnel electroresistance with highly discernible ON/OFF resistances, which makes possible non-destructive resistive readout. Moreover, an FTJ memory has read-out current that allows it to be integrated in a BEOL structure.

It has been observed that sufficient thermal treatment of the ferroelectric layer in an FTJ memory is necessary to achieve crystallization and good ferroelectricity. In some existing technologies, the thermal treatment of the ferroelectric layer is proceeded with caution as excessive heat may cause deterioration of FEOL structures, such as the gate structure. Oftentimes the temperature of the thermal treatment is kept below 400° C., which may cause insufficient crystallization of the ferroelectric layer.

The present disclosure provides a process and an FTJ memory structure to achieve crystallization of the ferroelectric layer without causing unintended damages to the FEOL structures. The FTJ memory of the present disclosure includes a light-transmissive top electrode layer, which allows transmission of radiation from a laser source during a laser annealing process. In a process according to the present disclosure, a bottom electrode layer, a ferroelectric layer, and the light-transmissive top electrode layer are deposited over a workpiece and a laser annealing is performed. During the laser annealing, radiation from a laser source transmits through the light-transmissive top electrode layer to locally heat the ferroelectric layer to a temperature between about 400° C. and about 1000° C. without subjecting the FEOL structure to excessive heat. At the same time, the light-transmissive top electrode layer exerts stress on the ferroelectric layer such that the ferroelectric layer may crystallize in a crystalline phase that exhibits ferroelectricity. The FTJ memory structure and the process provide improved crystallization of the ferroelectric layer with little or no risk of damaging the FEOL structures.

The various aspects of the present disclosure will now be described in more detail with reference to the figures. In that regard, FIGS. 1 and 14 show flowcharts illustrating a method 100 and a method 400 of forming a device structure from a workpiece 200, according to various aspects of the present disclosure. The methods 100 and 400 are merely examples and are not intended to limit the present disclosure to what is explicitly illustrated in the methods 100 and 400. Additional steps can be provided before, during and after the method 100 or 400, and some steps described can be replaced, eliminated, or moved around for additional embodiments of the methods. Not all steps are described herein in detail for reasons of simplicity. The method 100 is described below in conjunction with FIG. 2-13, which are fragmentary cross-sectional views of the workpiece 200 at different stages of fabrication according to various embodiments of the method 100. Similarly, the method 400 is described below in conjunction with FIGS. 2-4 and 15-22, which are fragmentary cross-sectional views of the workpiece 200 at different stages of fabrication according to various embodiments of the method 400. Because the workpiece 200 will be fabricated into a device structure, the workpiece 200 may be referred to herein as a device structure 200 as the context requires. For avoidance of doubts, the X, Y and Z directions in the figures are perpendicular to one another. Throughout the present disclosure, unless expressly otherwise described, like reference numerals denote like features.

The device structure 200 shown in the figures of the present disclosure is simplified and not all features in the device structure 200 are illustrated or described in detail. The device structure 200 shown in the figures may be a portion of an IC chip, a system on chip (SoC), or portion thereof, that may include various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof.

Figure 2:
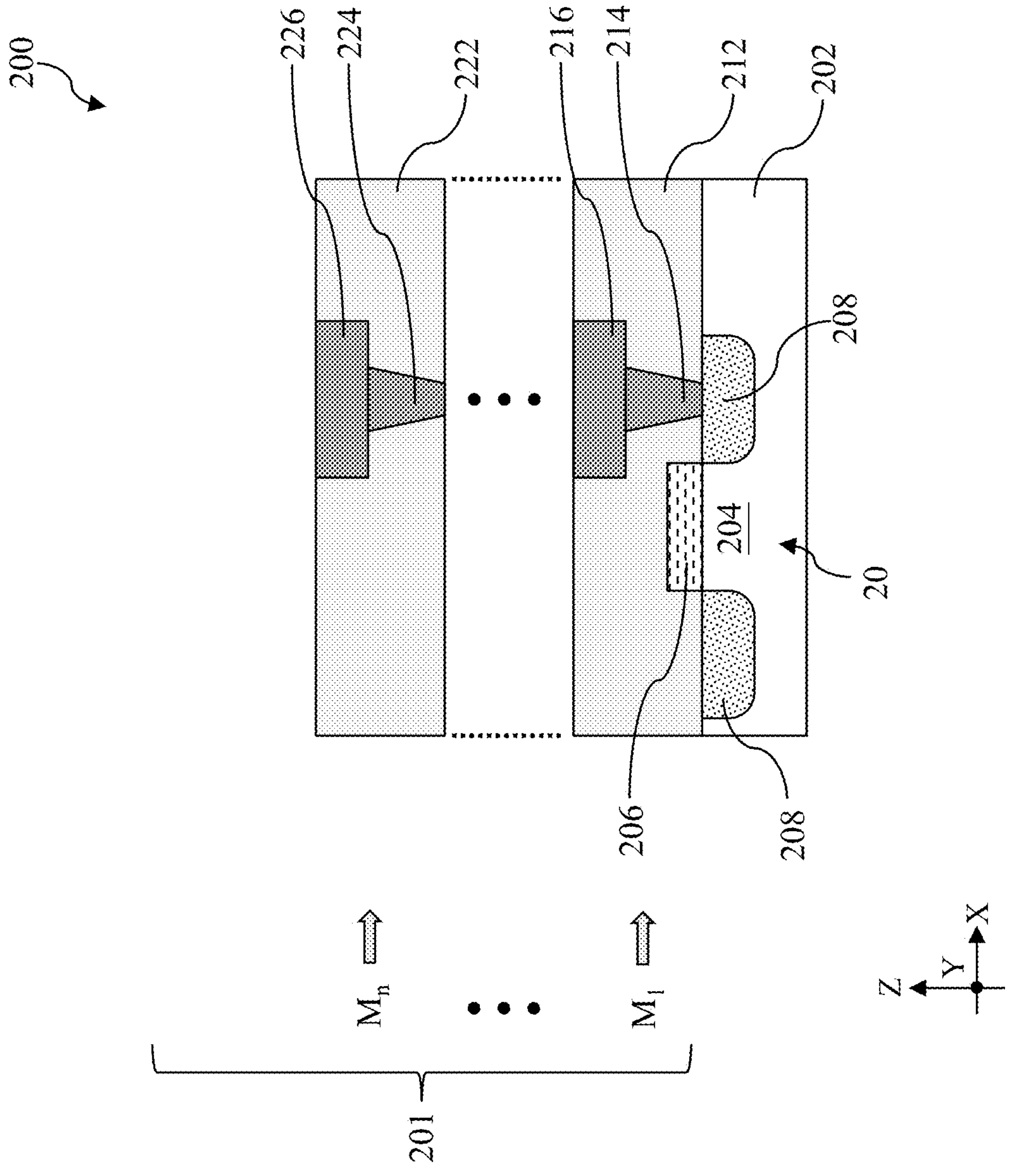
FIGS. 2-13 are fragmentary cross-sectional views of a workpiece undergoing operations of the method 100 in FIG. 1, according to various aspects of the present disclosure.

Referring to FIGS. 1 and 2, method 100 includes a block 102 where a workpiece 200 is provided. The workpiece 200 includes a substrate 202. In an embodiment, the substrate 202 includes silicon (Si). Alternatively or additionally, substrate 202 may include another elementary semiconductor, such as germanium (Ge); a compound semiconductor, such as silicon carbide (SiC), gallium arsenide (GaAs), gallium phosphide (GaP), indium phosphide (InP), indium arsenide (InAs), and/or indium antimonide; an alloy semiconductor, such as silicon germanium (SiGe), GaAsP, AlInAs, AlGaAs, GalnAs, GaInP, and/or GaInAsP; or combinations thereof. Alternatively, the substrate 202 may be a semiconductor-on-insulator substrate, such as a silicon-on-insulator (SOI) substrate, a silicon germanium-on-insulator (SGOI) substrate, or a germanium-on-insulator (GeOI) substrate. Semiconductor-on-insulator substrates can be fabricated using separation by implantation of oxygen (SIMOX), wafer bonding, and/or other suitable methods. Substrate 202 can include various doped regions (not shown) depending on design requirements of device structure 200. In some implementations, substrate 202 includes p-type doped regions (for example, p-type wells) doped with p-type dopants, such as boron (for example, $BF_2$), indium, other p-type dopant, or combinations thereof. In some implementations, substrate 202 includes n-type doped regions (for example, n-type wells) doped with n-type dopants, such as phosphorus (P), arsenic (As), other n-type dopant, or combinations thereof. In some implementations, substrate 202 includes doped regions formed with a combination of p-type dopants and n-type dopants. The various doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions.

In the depicted embodiments, the workpiece 200 includes a device 20 fabricated on the substrate 202. The device 20 may be a planar transistor or a multi-gate transistor, such as a fin-like FET (FinFET) or a gate-all-around (GAA) transistor. A GAA transistor may include channel regions of various shapes including nanowire, nanobar, or nanosheet, which may be collectively referred to as nanostructures. A GAA transistor may also be referred to as a multi-bridge-channel (MBC) transistor or a surrounding-gate-transistor (SGT). The device 20 representatively shown in FIG. 2 is a planar device that includes a gate structure 206 disposed over a channel region of an active region 204 and source/drain regions 208. The active region 204 may be formed from the substrate 202, which may be a silicon (Si) substrate, or from an epitaxial layer formed on the substrate 202. In the latter case, the epitaxial layer may include germanium (Ge) or silicon germanium (SiGe). While the device 20 is shown as a planar device in FIG. 2 and subsequent figures, it should be understood that the device 20 may as well be a FinFET or a GAA transistor.

While not explicitly shown, the gate structure 206 includes an interfacial layer interfacing the fin structure, a gate dielectric layer over the interfacial layer, and a gate electrode layer over the gate dielectric layer. The interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The gate dielectric layer may include a high-k dielectric material, such as hafnium oxide. Alternatively, the gate dielectric layer may include other high-K dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material. The gate dielectric layer may be formed by ALD, physical vapor deposition (PVD), CVD, oxidation, and/or other suitable methods.

The gate electrode layer of the gate structure 206 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof.

The source/drain regions 208 may be doped regions or deposited using vapor-phase epitaxy (VPE), ultra-high vacuum CVD (UHV-CVD), molecular beam epitaxy (MBE), and/or other suitable processes. When the source/drain region 208 is n-type, it may include silicon (Si) doped with an n-type dopant, such as phosphorus (P) or arsenic (As). When the source/drain regions 208 is p-type, it may include silicon germanium (SiGe) doped with a p-type dopant, such as boron (B) or boron difluoride ($BF_2$). In some alternative embodiments not explicitly shown in the figures, the source/drain regions 208 may include multiple layers. In one example, a source/drain region 208 may include a lightly doped first epitaxial layer over source/drain region of the fin structure, a heavily doped second epitaxial layer over the lightly doped first epitaxial layer, and a capping epitaxial layer disposed over the heavily doped second epitaxial layer. The first epitaxial layer has a lower dopant concentration or a smaller germanium content (when germanium is present) than the second epitaxial layer to reduce lattice mismatch defects. The second epitaxial layer has the highest dopant concentration or the highest germanium content (when germanium is present) to reduce resistance and increase strain on the channels. The capping epitaxial layer may have a smaller dopant concentration and germanium content (when germanium is present) than the second epitaxial layer to increase etching resistance.

Although not explicitly shown in FIG. 2, multiple active regions similar to the active region 204 are formed over the substrate 202. The active regions may be isolated from one another by an isolation feature. In some implementations, the isolation features may be formed by etching a trench in substrate 202 or an epitaxial layer on the substrate 202 using a dry etch process and filling the trench with insulator material using a chemical vapor deposition (CVD) process, flowable CVD (FCVD) process, or a spin-on glass process. A chemical mechanical polishing (CMP) process may be performed to remove excessive insulator material and to provide a planar surface. In the depicted embodiment, the isolation feature is formed after the CMP process. When the device 20 is a multi-gate device that includes a fin structure or a fin-like structure, the insulator material may be etched back to form the isolation feature such that the fin structure or fin-like structure rises above the isolation feature. In some implementations, the isolation features may include a multi-layer structure that includes a liner dielectric layer and bulk dielectric layer. The isolation feature may include silicon oxide, silicon oxynitride, boron silicate glass (BSG), or phosphosilicate glass (PSG). Although not explicitly shown in the figures, when the device 20 is a multi-gate device, the workpiece 200 may also include MEOL structures, which may include a source/drain contact or a gate contact via disposed in one or more interlayer dielectric (ILD) layers. The ILD layers may include silicon oxide, tetraethylorthosilicate (TEOS) oxide, un-doped silicate glass (USG), or doped silicate glass such as borophosphosilicate glass (BPSG), fused silicate glass (FSG), phosphosilicate glass (PSG), boron doped silicate glass (BSG), and/or other suitable dielectric materials. The source/drain contact may include ruthenium (Ru), cobalt (Co), nickel (Ni), or copper (Cu). The gate contact via may include tungsten (W), ruthenium (Ru), cobalt (Co), nickel (Ni), or copper (Cu).

In the embodiments depicted in FIG. 2, the workpiece 200 further includes a part of an interconnect structure 201. The interconnect structure 201 includes multiple metal layers, including the illustrated first metal layer $M_1$ to the nth metal layer $M_n$, with the dots representing intervening metal layers between $M_1$ and $M_n$. Further metal layers of the interconnect structure 201 will be formed over the nth metal layer $M_n$. In some embodiments, the interconnect structure may include about nine (9) to about thirteen (13) metal layer and the number n of the nth metal layer $M_n$ may be greater than 2. While it is possible to perform processes of the present disclosure right after the formation of the device 20, doing that may incur greater risk to damage the FEOL structures. That is, there may be zero (0) to eleven (11) layers between the first metal layer $M_1$ and the nth metal layer $M_n$. Each of the metal layers of the interconnect structures include multiple vias and metal lines embedded in at least one intermetal dielectric (IMD) layer. The vias and metal lines may be formed of titanium (Ti), ruthenium (Ru), nickel (Ni), cobalt (Co), copper (Cu), molybdenum (Mo), tungsten (W), or aluminum (Al). In one embodiment, they are formed of copper (Cu). The IMD layer may have a composition similar to that of the ILD layers described above. In the depicted embodiment, the first metal layer $M_1$ includes a first via 214 and a first metal line 216 disposed on the first via 214. Both the first via 214 and the first metal line 216 are embedded or disposed in a first IMD layer 212. Similarly, the nth metal layer $M_n$ includes a top via 224 and a top metal line 226, which are embedded or disposed in an nth IMD layer 222. In the embodiments represented in FIG. 2, n is 3 and there is one additional metal layer between the first metal layer $M_1$ and the nth metal layer $M_n$. It is noted that the top metal line 226, as used herein, denotes a top metal line on which the memory stack is formed. Further metal layers will be formed over the memory stack and the nth metal layer $M_n$.

Figure 3:
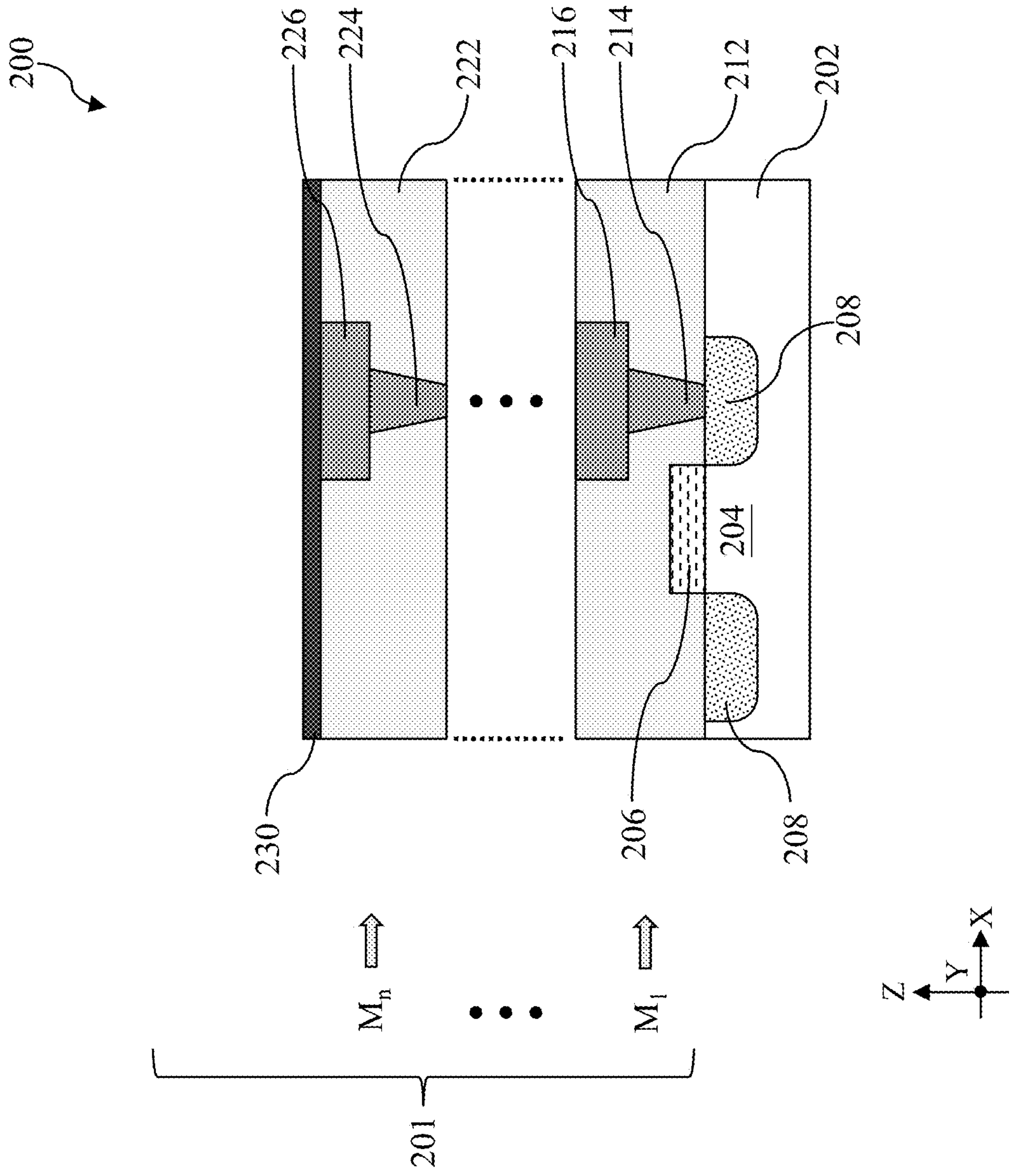

Referring to FIGS. 1 and 3, method 100 includes a block 104 where a first etch stop layer (ESL) 230 is deposited over the workpiece 200. In some embodiments, the first ESL 230 includes silicon carbide and may be deposited using chemical vapor deposition (CVD) or plasma enhanced CVD (PECVD). The first ESL 230 not only serves as an etch stop layer but also functions to prevent electromigration of metals in the top metal line 226 when the top metal line 226 is formed of copper or a copper-containing material. In some implementations, the first ESL 230 may have a thickness between about 200 nm and about 350 nm. This thickness is not trivial. When the thickness is less than 200 nm, the first ESL 230 may not sufficiently suppress the electromigration in the top metal line 226. When the thickness is greater than 350 nm, the first ESL 230 may take too much thickness to prevent the entire process to be performed to metal layers that have a smaller total thickness, such as the first three (3) or the first four (4) metal layers from the device 20.

Figure 4:
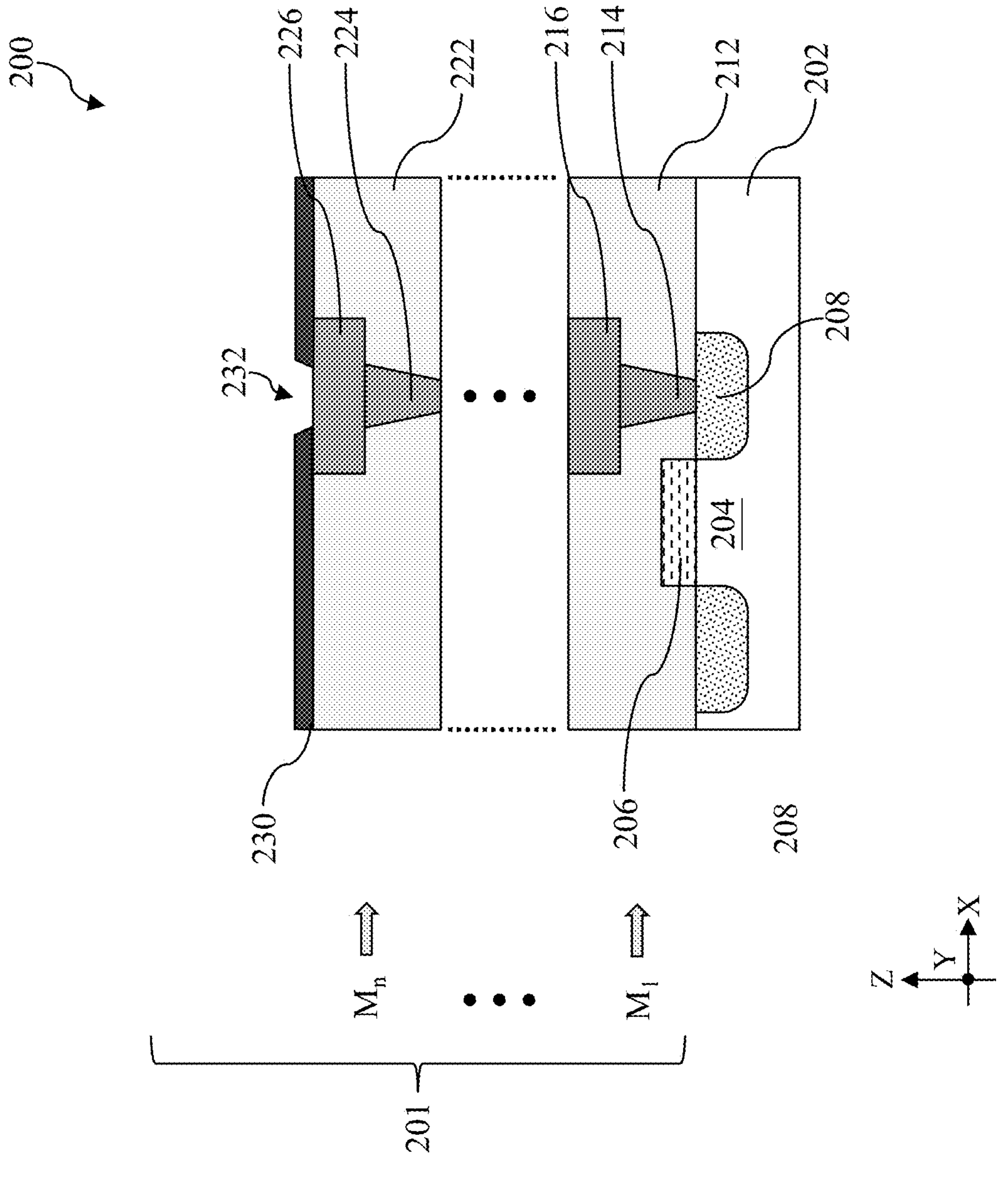

Referring to FIGS. 1 and 4, method 100 includes a block 106 where an opening 232 is formed through the first ESL 230 to expose the top metal line 226. The opening 232 may be formed through the first ESL 230 using a combination of photolithography processes and etching processes. For example, at least one hard mask is deposited over the first ESL 230 using CVD, flowable CVD (FCVD), or a suitable process. A photoresist layer is then deposited over the at least one hard mask layer using spin-on coating. The deposited photoresist layer may undergo an pre-exposure baking process, exposure to radiation reflected from or transmitted through a photomask, a post-exposure baking process, and developing process, so as to form a patterned photoresist. The at least one hard mask layer is then etched using the patterned photoresist as an etch mask to form a patterned hard mask. The patterned hard mask is then applied as an etch mask to etch the first ESL 230 to form the opening 232. Appropriate etch process at block 106 may be a dry etch process, a wet etch process, or a combination thereof. In some embodiments, the etch process at block 106 may be a dry etch process (e.g., a reactive ion etching (ME) process) that includes use of an oxygen-containing gas (e.g., $O_2$), a fluorine-containing gas (e.g., $SF_6$ or $NF_3$), or a chlorine-containing gas (e.g., $Cl_2$ and/or $BCl_3$). As shown in FIG. 4, the opening 232 extends completely through the first ESL 230 such that a top surface of the top metal line 226 is exposed.

Figure 5:
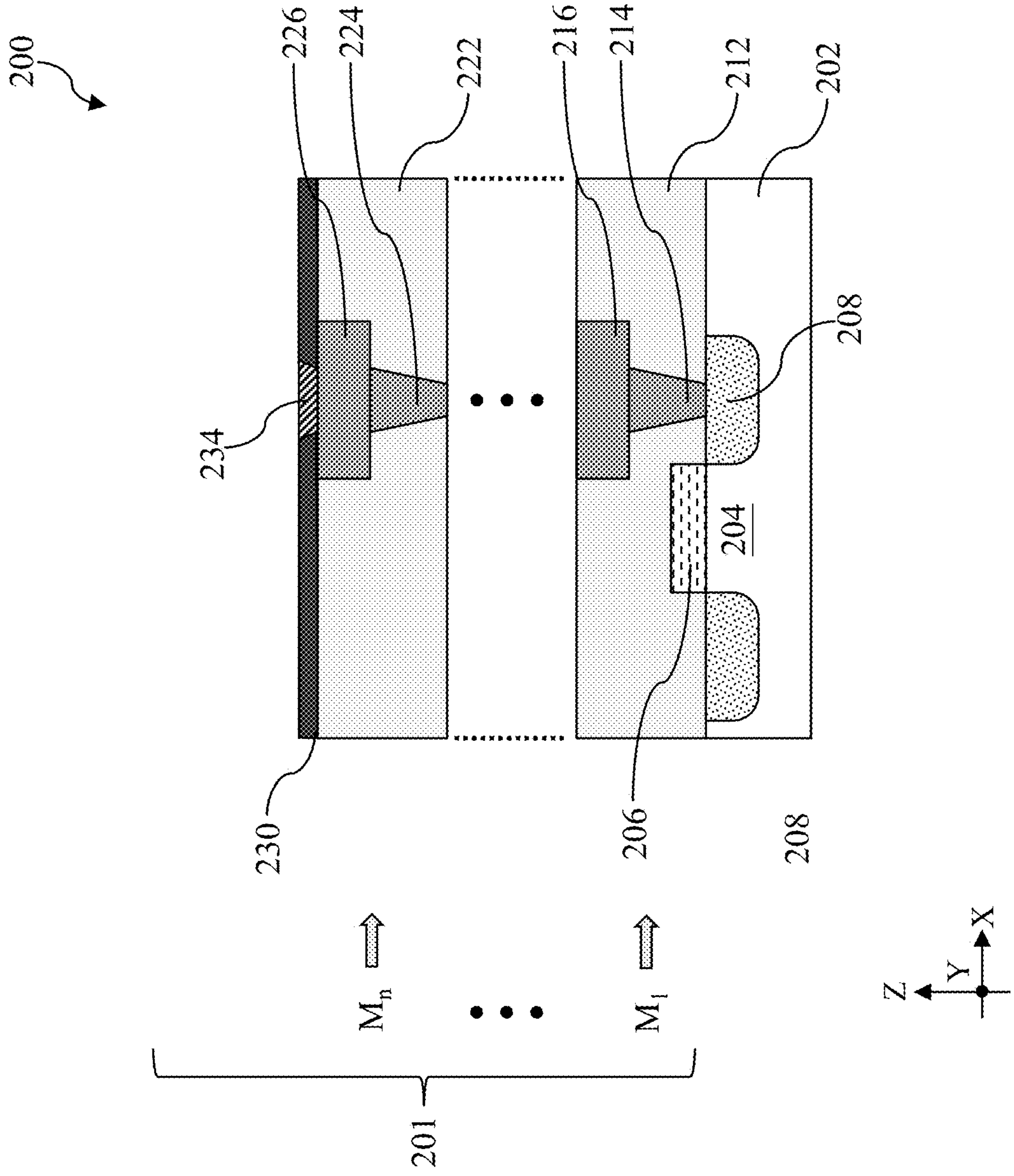

Referring to FIGS. 1 and 5, method 100 includes a block 108 where a contact via 234 is formed in the opening 232 to couple to the top metal line 226. In some embodiments, the contact via 234 may include titanium nitride (TiN), titanium (Ti), ruthenium (Ru), molybdenum (Mo), tungsten (W), or aluminum (Al). In one embodiment, the contact via 234 is formed of titanium nitride (TiN) as it tends to reduce electromigration of copper in the underlying top metal line 226. In one example process, conductive material for the contact via 234 is first deposited over the first ESL 230 and the opening 232 using CVD or physical vapor deposition (PVD) and then a planarization process, such as a chemical mechanical polishing (CMP) process, is performed to remove excess material over the first ESL 230. In another embodiment, the contact via 234 may be deposited using a bottom-up deposition method, such as atomic layer deposition (ALD) or metal organic CVD (MOCVD). In the latter example, the contact via 234 may be selectively deposited on the conductive surface of the top metal line 226 that is exposed via the opening 232.

Figure 6:
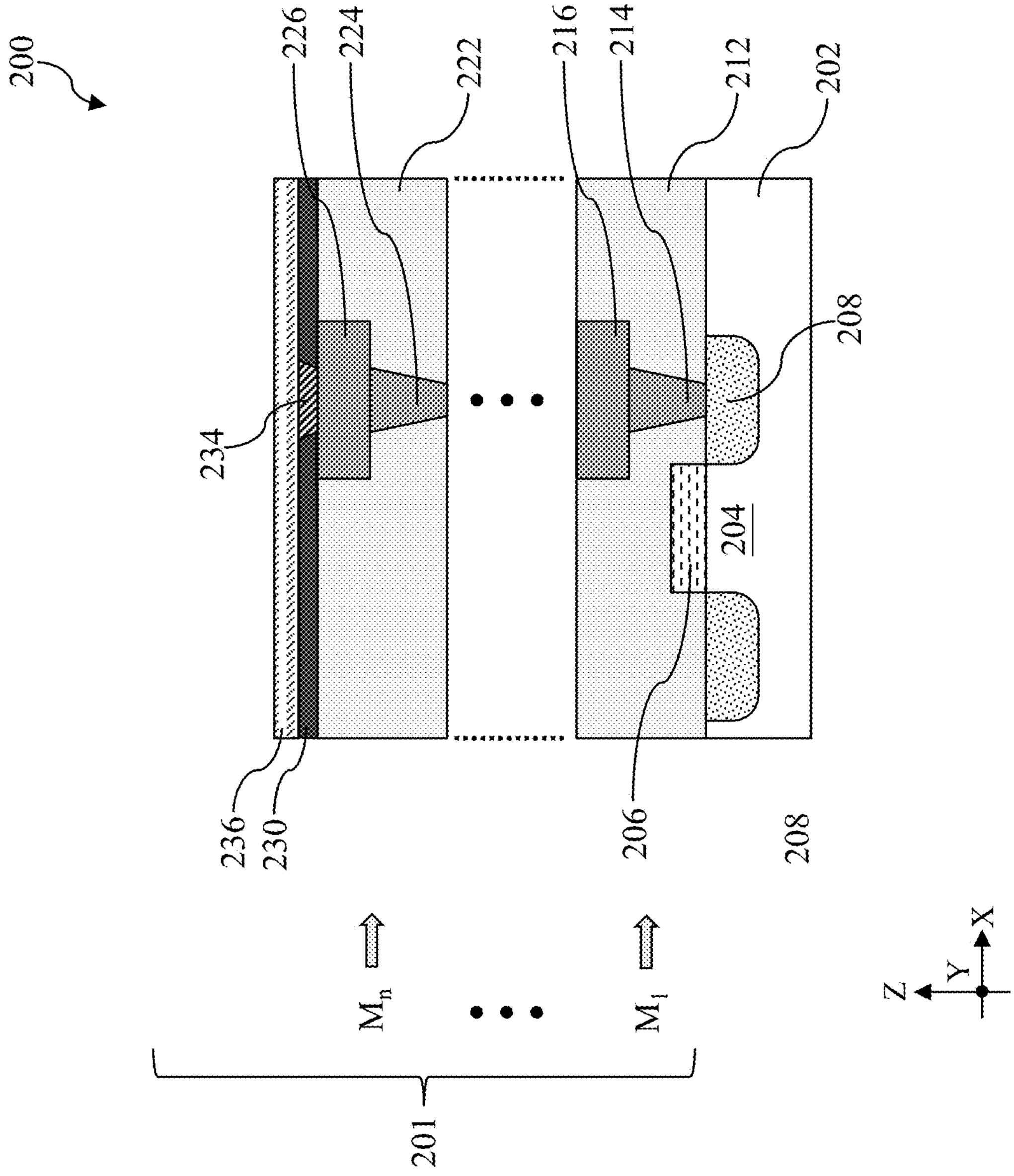

Referring to FIGS. 1 and 6, method 100 includes a block 110 where a bottom electrode layer 236 is deposited over the contact via 234 and the first ESL 230. In some embodiments, the bottom electrode layer 236 includes tantalum nitride (TaN), titanium nitride (TiN), tantalum (Ta), tungsten (W), platinum (Pt), ruthenium (Ru), iridium (Ir), or molybdenum (Mo). The bottom electrode layer 236 is blanketly deposited over the top surface of the workpiece 200, including top surfaces of the first ESL 230 and the contact via 234, using PVD or CVD. It is noted that because the bottom electrode layer 236 does not function to allow transmission of laser radiation, it is not light-transmissive and is not formed of translucent or transparent metal oxide. In some instances, the bottom electrode layer 236 may have a thickness between about 10 nm and about 20 nm. This thickness range is not trivial. When the thickness is smaller than 10 nm, the bottom electrode layer 236 may become less conductive as the electrical conducting mechanism at that thickness. When the thickness is greater than 20 nm, the bottom electrode layer 236, which may be formed of less conductive material such as titanium nitride (TiN), may introduce too much resistance.

Figure 7:
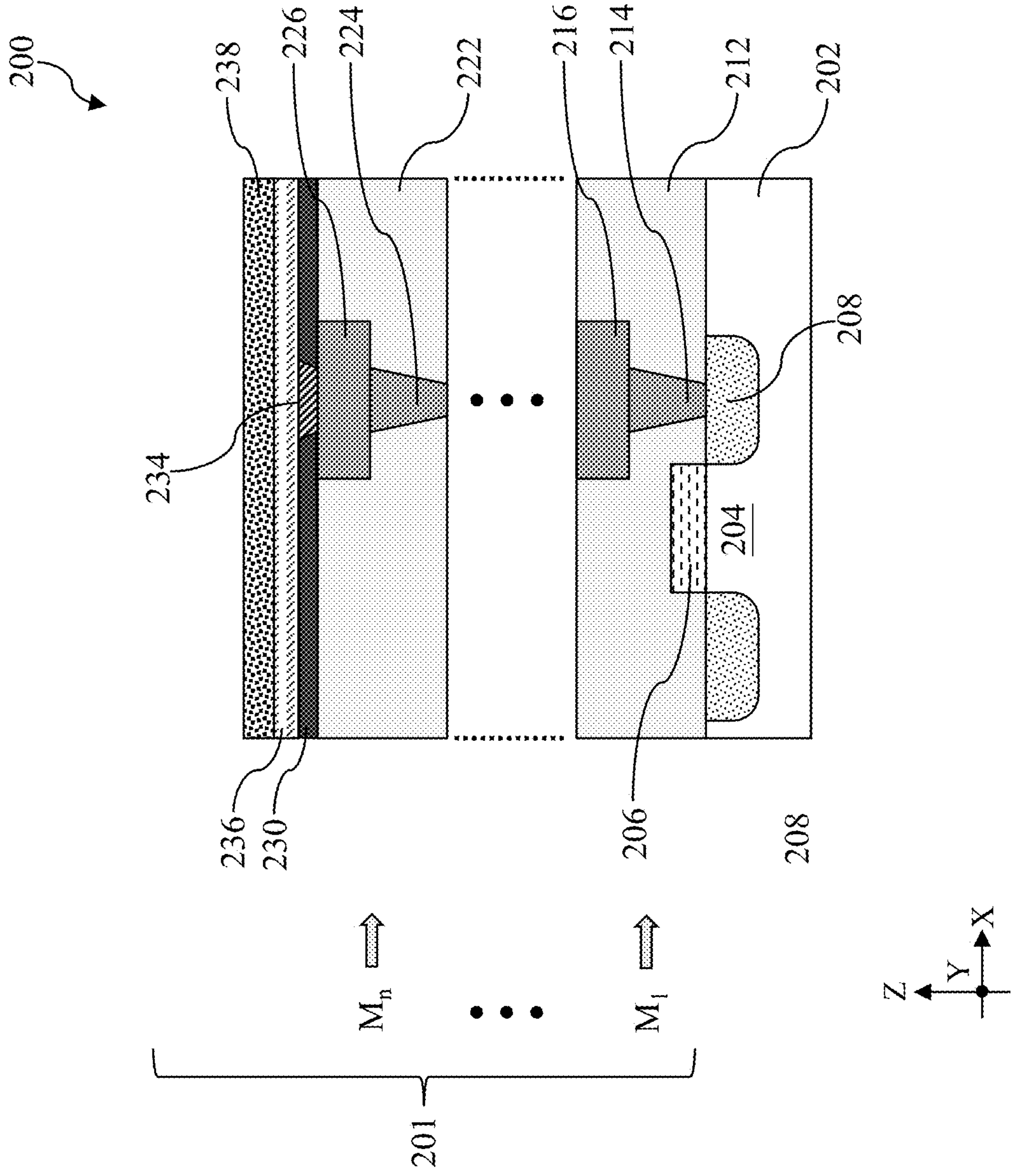

Referring to FIGS. 1 and 7, method 100 includes a block 112 where a ferroelectric layer 238 is deposited over the bottom electrode layer 236. The ferroelectric layer 238 may be a binary oxide, a ternary oxide, a ternary nitride, or a quaternary oxide that exhibits ferroelectricity. The ferroelectric layer 238 may be formed of hafnium oxide, hafnium silicate ($HfSiO_x$), hafnium zirconate ($HfZrO_x$), barium titanate ($BaTiO_3$), lead titanate ($PbTiO_3$), strontium titanate ($SrTiO_3$), calcium manganite ($CaMnO_3$), bismuth ferrite ($BiFeO_3$), aluminum scandium nitride (AlScN), aluminum gallium nitride (AlGaN), aluminum yttrium nitride (AlYN), doped $HfO_2$ (dopant: Si, Zr, Y, Al, Gd, Sr, La, Sc, Ge, etc.), lead zirconate titanate (PZT, $PbZr_xTi_yO_z$), barium strontium titanate ($BaSrTiO_x$), or strontium bismuth tantalate (SBT, $SrBi_2Ta_2O_9$). In one embodiment, the ferroelectric layer 238 includes zirconium-doped hafnium oxide or hafnium zirconium oxide (HZO). As shown in FIG. 7, the ferroelectric layer 238 may be blanketly deposited over the workpiece 200, including over the bottom electrode layer 236, using PVD, CVD, or atomic layer deposition (ALD). It is noted that, as deposited at block 112, the ferroelectric layer 238 may not exhibit ferroelectricity as its deposition method may not provide it with sufficient crystallinity. In that sense, the ferroelectric layer 238 deposited at block 112 may be regarded as a ferroelectric precursor 238. As described above, the ferroelectric layer 238 is thin enough to allow quantum-mechanical tunneling. In some instances, the ferroelectric layer 238 may have a thickness between about 1 nm and about 10 nm. The thickness of the ferroelectric layer 238 is smaller than the thickness of the bottom electrode layer 236.

Figure 8:
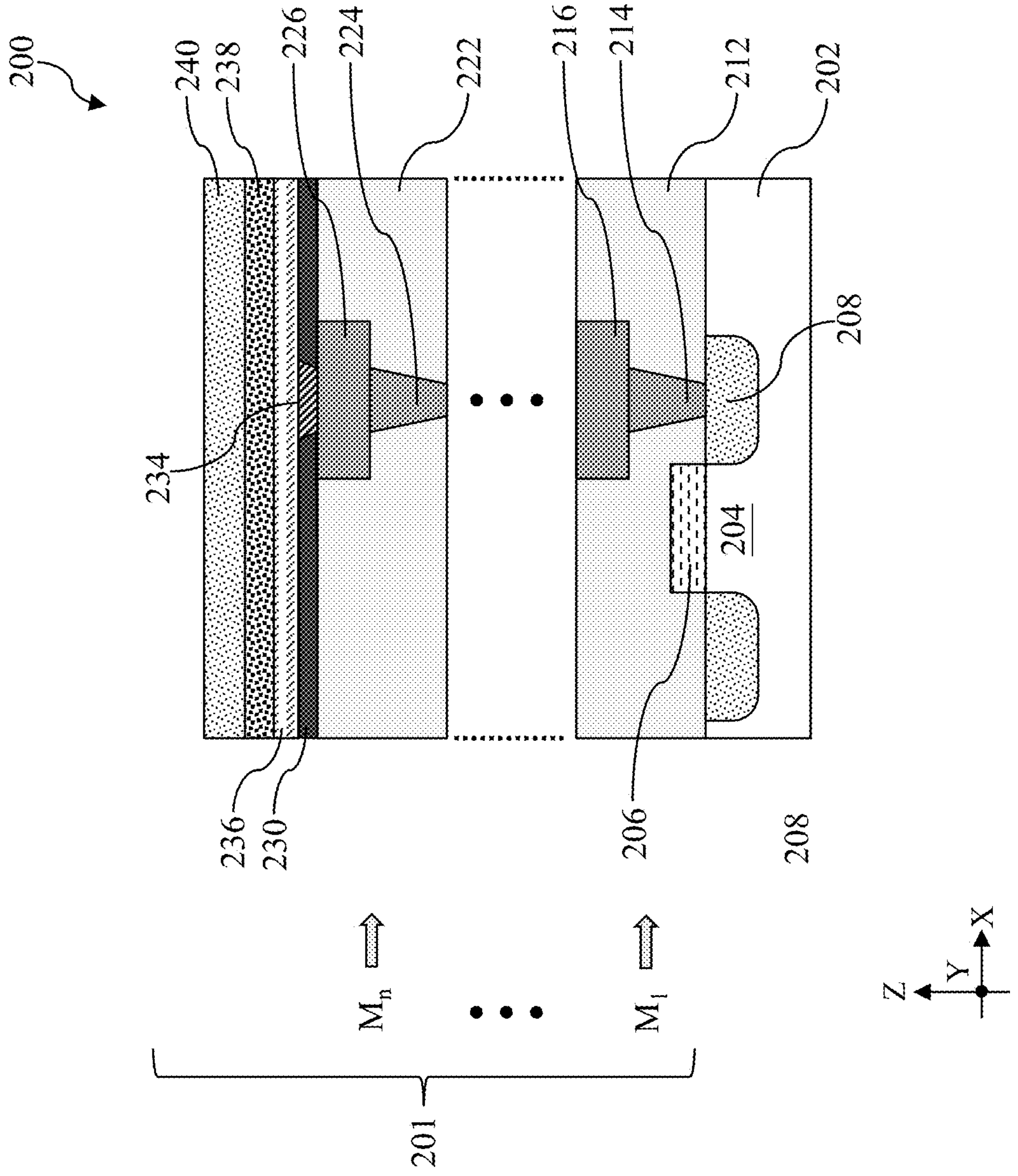

Referring to FIGS. 1 and 8, method 100 includes a block 114 where a top electrode layer 240 is deposited over the ferroelectric layer 238. The top electrode layer 240 is formed of a light-transmissive conductive material. In some embodiments, the top electrode layer 240 is formed of a conductive metal oxide such as indium-tin oxide (ITO), zinc oxide (ZnO), fluorine doped tin oxide (FTO), gallium zinc oxide (GZO), aluminum zinc oxide (AZO), antimony tin oxide (ATO). The top electrode layer 240 may be deposited using physical vapor deposition (PVD) or sol-gel processes. In some implementations, the deposited top electrode layer 240 may be annealed to improve electrical conductivity. In some instances, the annealing of the top electrode layer 240 may include use of a carbon dioxide ($CO_2$) laser source. According to the present disclosure, the top electrode layer 240 is formed of a material that allows at least partial transmission of radiation of a laser source. In some instances, the rate of transmission for the top electrode layer 240 may be greater than 30% or the purposes of having a light-transmissive top electrode layer 240 would be defeated. That is, the top electrode layer 240 is translucent or transparent to radiation from such a laser source. As used herein, the laser source refers to a laser source for a laser annealing operation. Example laser sources include a helium-neon (He—Ne) laser source, a Neodymium:Yttrium-Aluminum-Garnet (Nd:YAG) Laser source, an argon ion (Ar+) laser source, a continuous-wave (CW) argon laser source, a krypton ion (Kr+) laser source, a GaAs diode laser source, or a helium-cadmium (He—Cd) laser source. Because most of these example laser sources emit radiation in the visible light spectrum, the top electrode layer 240 can be said to be translucent or transparent to visible light. In some instances, the top electrode layer 240 may have a thickness between about 10 nm and about 20 nm. When the thickness is smaller than 10 nm, the top electrode layer 240 may become less conductive as the electrical conducting mechanism at that thickness. When the thickness is greater than 20 nm, the top electrode layer 240, which may be formed of less conductive metal oxides, may introduce too much resistance. While not explicitly illustrated in the figures, operations at block 114 may include a low-temperature anneal of the top electrode layer 240 to increase it light transmission and conductivity. In some instances, the lower temperature anneal may include use of an oven and an anneal temperature between 100° C. and about 200° C.

Figure 9:
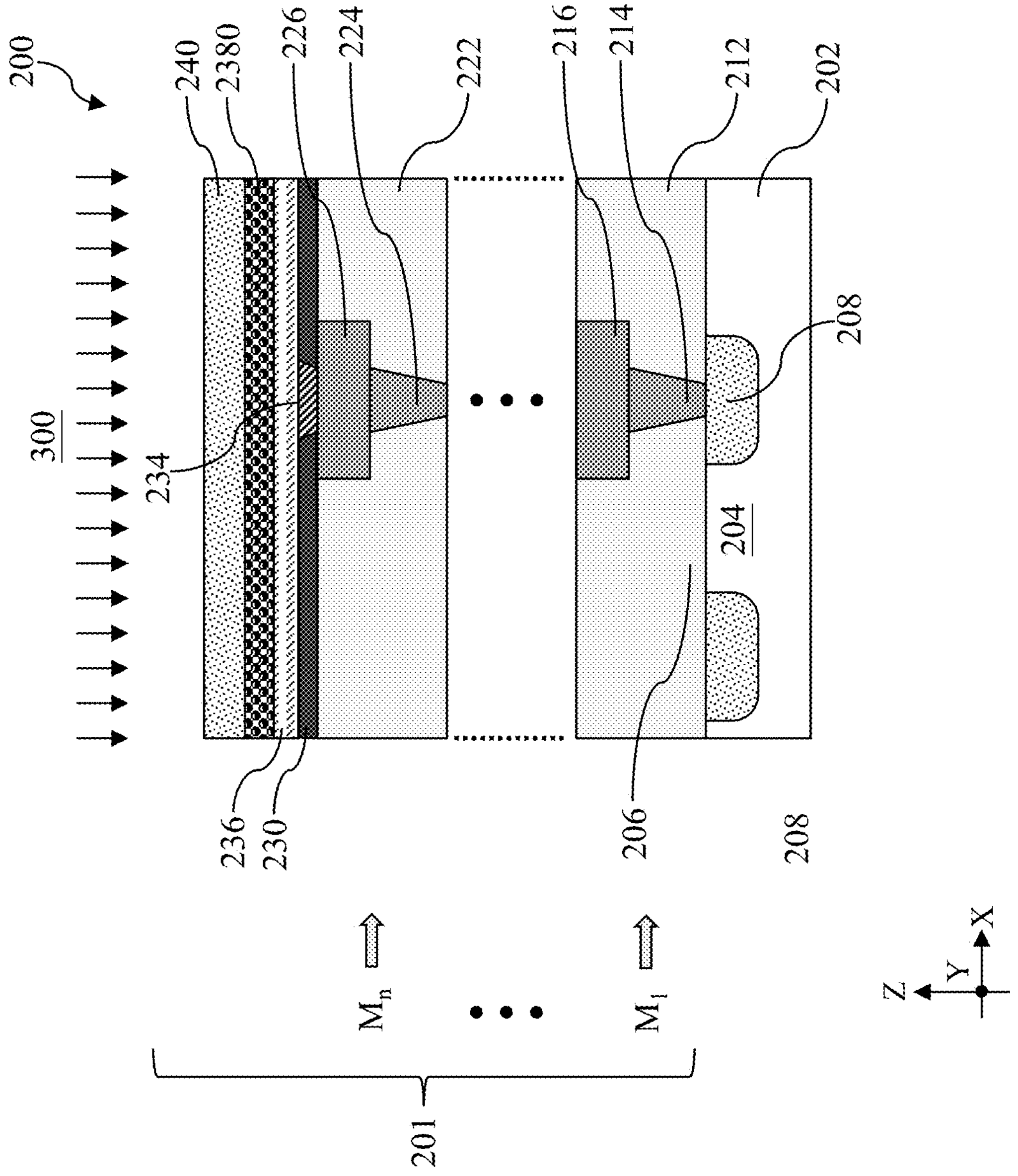

Referring to FIGS. 1 and 9, method 100 includes a block 116 where a laser anneal 300 is performed to the ferroelectric layer 238. As described above, the as-deposited ferroelectric layer 238 may not exhibit ferroelectricity due to lack of crystallinity. To increase the crystallization in the ferroelectric layer 238, the laser anneal 300 is performed at block 116. While the laser anneal 300 is shown in FIG. 9 as irradiating on the entire workpiece 200, the laser anneal 300 may include scanning or stepping through substantially the entire top surface of the top electrode layer 240. As generally described above with respect to the operations at block 114, the top electrode layer 240 is translucent or transparent to radiation from the laser source used in laser annealing operations, such as the laser anneal 300 in FIG. 9. The radiation from the laser anneal 300 may then at least partially transmit through an entire thickness of the top electrode layer 240 and effectively reach the ferroelectric layer 238. The radiation, however, is blocked by the underlying layers (such as the bottom electrode layer 236 or the first ESL 230) and does not reach the FEOL structures, such as the device 20. That is, by having the light-transmissive top electrode layer 240 over the ferroelectric layer 238, the laser anneal 300 can effectively anneal the ferroelectric layer 238 to promote crystallization and ferroelectricity without much risk of damaging the FEOL structures. In some embodiments, the laser anneal 300 includes use of a helium-neon (He—Ne) laser source, a helium-neon (He—Ne) laser source, a Neodymium:Yttrium-Aluminum-Garnet (Nd:YAG) Laser source, an argon ion (Ar+) laser source, a continuous-wave (CW) argon laser source, a krypton ion (Kr+) laser source, a GaAs diode laser source, or a helium-cadmium (He—Cd) laser source. and may include an annealing temperature between about 400° C. and about 1000° C. This annealing temperature range is not trivial. When the annealing temperature is below 400° C., crystallization of the ferroelectric layer 238 happens slowly and the laser anneal 300 may not achieve sufficient crystallization to ensure ferroelectric property. When the annealing temperature is greater than 1000° C., the thermal energy may cause damages to the top metal line 226 or the top via 224. To demonstrate the effect of the laser anneal 300, the post-anneal ferroelectric layer 238 is relabeled as ferroelectric layer 2380. The ferroelectric layer 2380 shares the same composition with the ferroelectric layer 238 but is more crystallized to exhibit stronger ferroelectricity.

It is observed that the ferroelectric layer 238, when annealed without being subject to strain from the top electrode layer 240, does not form the phase that exhibits ferroelectricity. It can be seen that the top electrode layer 240 of the present disclosure provide several functions. First, it serves as the top electrode of the memory stack. To serve that function, the top electrode layer 240 is electrically conductive. Second, the top electrode layer 240 exerts tensile stress on the ferroelectric layer 238 such that the ferroelectric layer 238 may crystallize in phases that exhibit ferroelectricity. In that regard, the top electrode layer 240 serves as a stress source or a straining layer. Third, the top electrode layer 240 of the present disclosure is translucent or transparent to radiation of the laser source used in the laser anneal 300.

Figure 10:
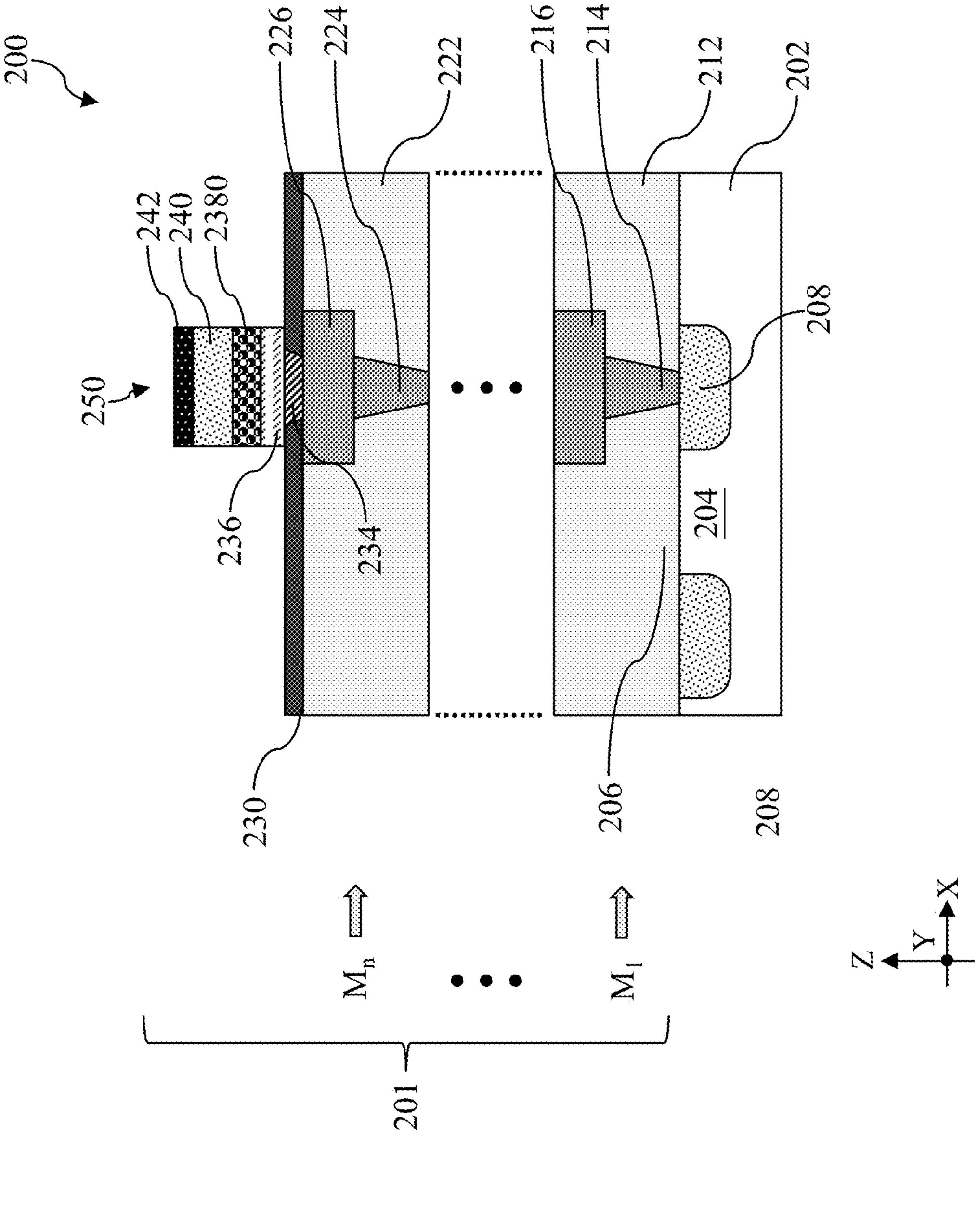

Referring to FIGS. 1 and 10, method 100 includes a block 118 where the bottom electrode layer 236, the ferroelectric layer 2380 and the top electrode layer 240 are patterned to form a first memory stack 250. After the laser anneal 300 of the ferroelectric layer 238 through the top electrode layer 240 at block 116, a combination of photolithography processes and etching processes are performed to pattern the bottom electrode layer 236, the ferroelectric layer 2380 and the top electrode layer 240. In an example process, a hard mask layer 242 is blanketly deposited over the top electrode layer 240 using CVD. The hard mask layer 242 may include silicon oxide, silicon nitride, or silicon oxynitride. It is noted that a composition of the hard mask layer 242 is different from a composition of the first ESL 230. A photoresist layer is then deposited over the hard mask layer 242 using spin-on coating. The deposited photoresist layer may undergo an pre-exposure baking process, exposure to radiation reflected from or transmitted through a photomask, a post-exposure baking process, and developing process, so as to form a patterned photoresist. The hard mask layer 242 is then etched using the patterned photoresist as an etch mask to form a patterned hard mask layer 242. The patterned hard mask layer 242 is then applied as an etch mask to etch the bottom electrode layer 236, the ferroelectric layer 2380 and the top electrode layer 240 to form the first memory stack 250. Appropriate etch process at block 118 may be a dry etch process (e.g., a reactive ion etching (RIE) process) that includes use of an oxygen-containing gas (e.g., $O_2$), a fluorine-containing gas (e.g., $SF_6$ or $NF_3$), a chlorine-containing gas (e.g., $Cl_2$ and/or $BCl_3$), a bromine-containing gas (e.g., HBr), an iodine-containing gas, other suitable gases and/or plasmas, and/or combinations thereof. As shown in FIG. 10, the first memory stack 250 includes the bottom electrode layer 236, the ferroelectric layer 2380, the top electrode layer 240, and the patterned hard mask layer 242. Because the ferroelectric layer 2380 has a thickness to allow quantum-mechanical tunneling, the first memory stack 250 is an FTJ stack or an FTJ memory device. The first memory stack 250 is disposed directly over the contact via 234 such that the top surface of the contact via 234 physically couples to the bottom surface of the bottom electrode layer 236. In the depicted embodiments, the patterned hard mask layer 242 remains in the first memory stack 250. In these embodiments, the patterned hard mask layer 242 is left in place because removing it may damage the top electrode layer 240 and it does not substantially hinder formation of any contact structure from over the first memory stack 250.

Figure 11:
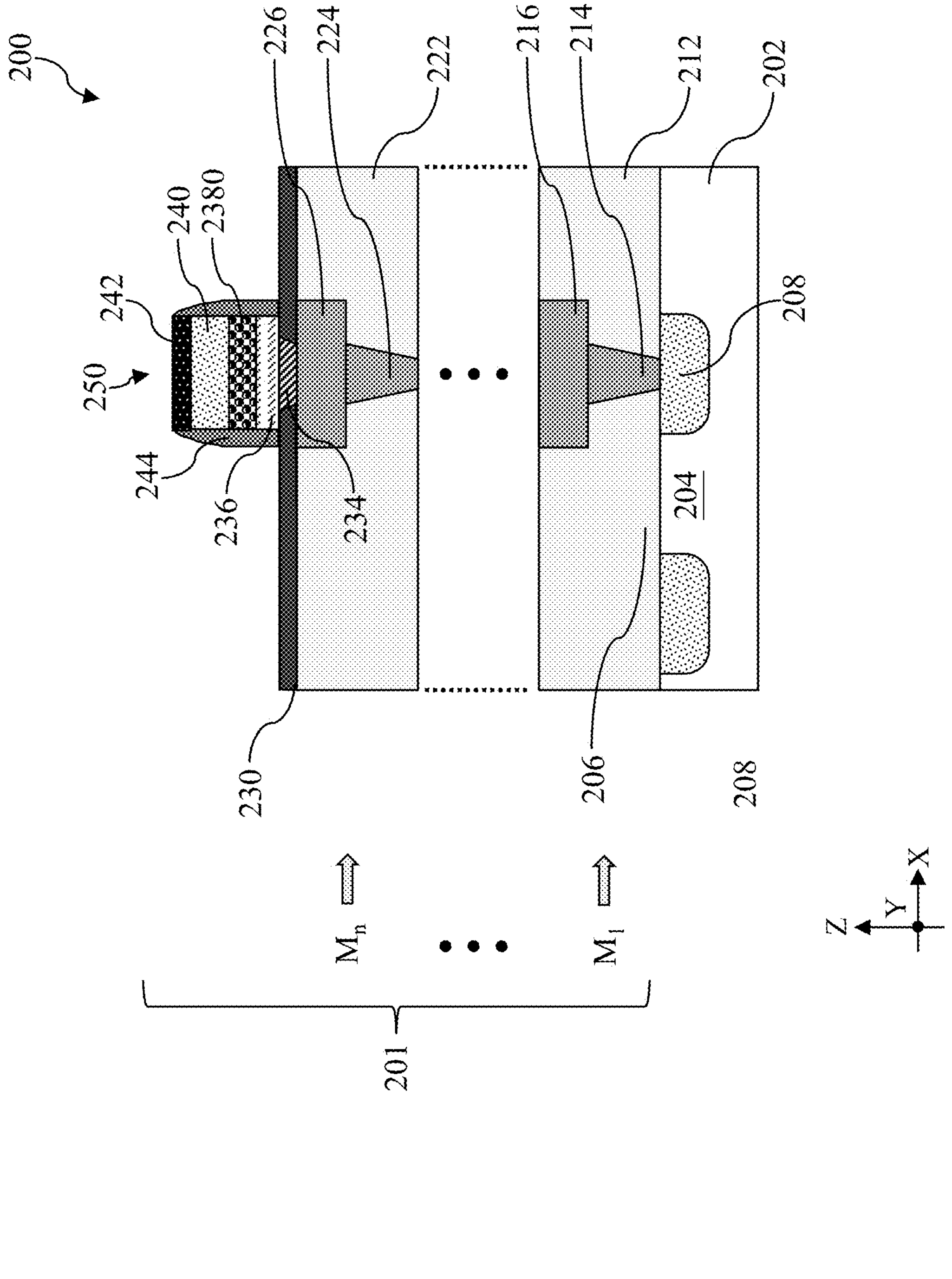
Figure 12:
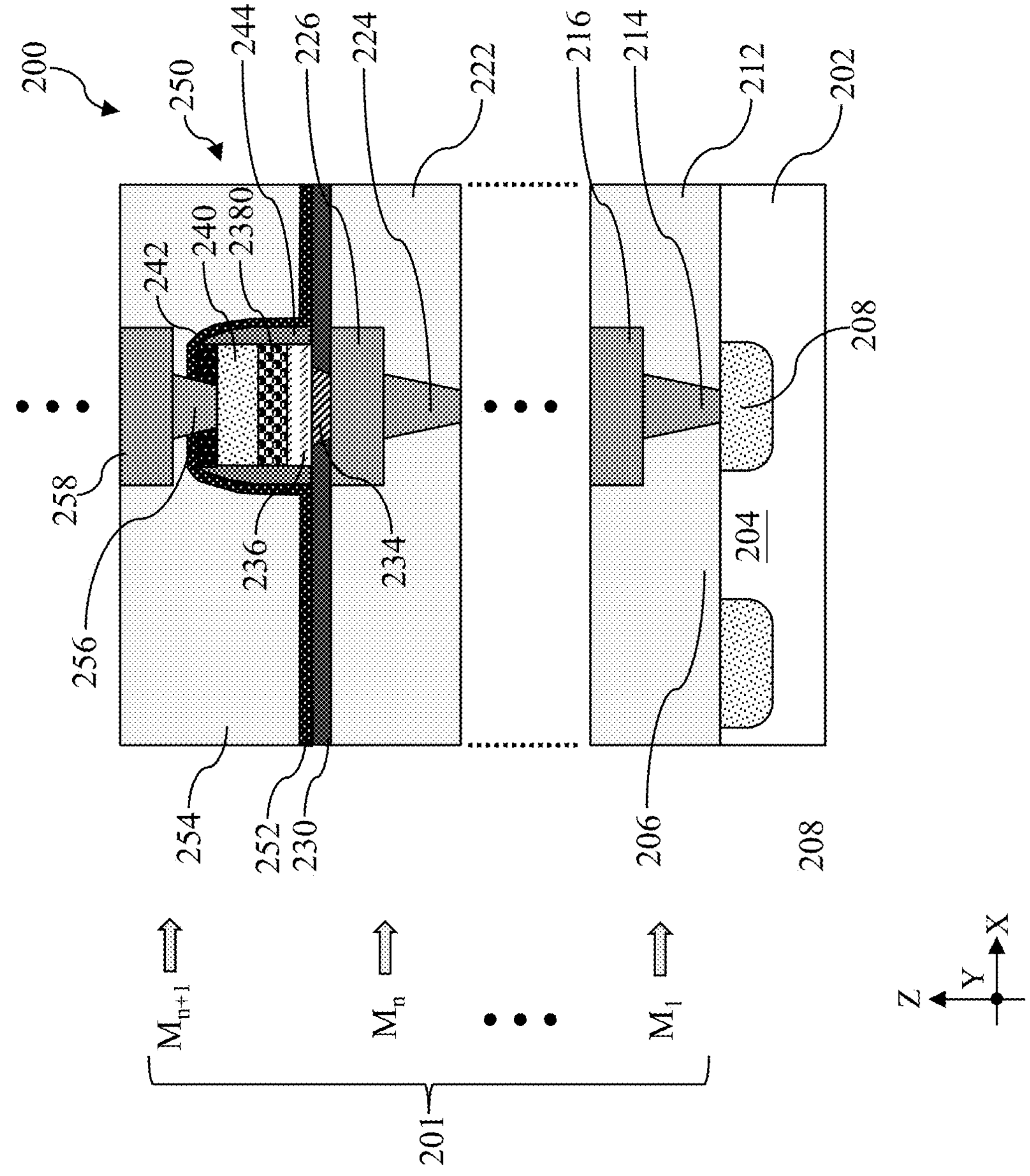

Referring to FIGS. 1, 11 and 12, method 100 includes a block 120 where further processes are performed. Such further processes at block 120 may include formation of a spacer 244 along sidewalls of the first memory stack 250 (shown in FIG. 11), deposition of a second ESL 252 over the first memory stack 250 and the spacer 244 (shown in FIG. 12), deposition of an (n+1) th IMD layer 254 over the second ESL 252 (shown in FIG. 12), and formation of an (n+1) th via 256 and an (n+1) th metal line 258 through the IMD layer 254 and the second ESL 252 (shown in FIG. 12). The spacer 244 shown in FIG. 11 may be formed by conformally depositing a spacer material layer over the workpiece 200, including over the first memory stack 250 and then anisotropically etching back the spacer material layer. As shown in FIG. 11, the spacer 244 only overs a portion of the first ESL 230 and a majority of the first ESL 230 is exposed after the formation of the spacer 244. In some embodiments, the spacer 244 may include silicon nitride. Then, referring to FIG. 12, the second ESL 252 is conformally deposited over the first ESL 230. The second ESL 252 is formed from a different material than the first ESL 230. In some implementations, the second ESL 252 includes silicon nitride. This selection of material for the second ESL 252 is not trivial. Besides serving as an extra etch stop layer or protective layer in additional the patterned hard mask layer 242, the second ESL 252 functions to exert additional stress on the first memory stack 250, especially the ferroelectric layer 2380. In an example process, a second ESL 252, which is formed of silicon nitride, is conformally deposited over the first memory stack 250 and an anneal process with an anneal temperature between about 350° C. and about 400° C. is performed to introduce stress in the second ESL 252. The second ESL 252 exerts additional stress to stabilize the ferroelectricity in the ferroelectric layer 2380. It can yet again be seen that annealing alone does not by itself ensure ferroelectricity in the ferroelectric layer 2380.

After the deposition of the second ESL 252, the (n+1)th IMD layer 254 is deposited over the workpiece 200. The IMD layer 254 shares the same composition with the first IMD layer 212 and detailed description thereof is omitted for brevity. A dual damascene may then be performed to form the (n+1)th via 256 and the (n+1)th metal line 258 through the IMD layer 254 and the second ESL 252 such that the (n+1)th via 256 physically couples to the top electrode layer 240. The (n+1)th via 256 and the (n+1)th metal line 258 may be similar to the first via 214 and the first metal line 216 in terms of compositions and detailed descriptions thereof are omitted for brevity. It is noted that each of the vias and metal line may be a continuous structure as they are formed using a dual damascene process. The line between a via and an overlying metal line is shown only to facilitate the understanding. Although not explicitly shown in the figures, further metal layers (such as $M_{n+2}$, $M_{n+3}$, and so on), may be formed over the (n+1) metal layer to complete the interconnect structure 201.

Figure 13:
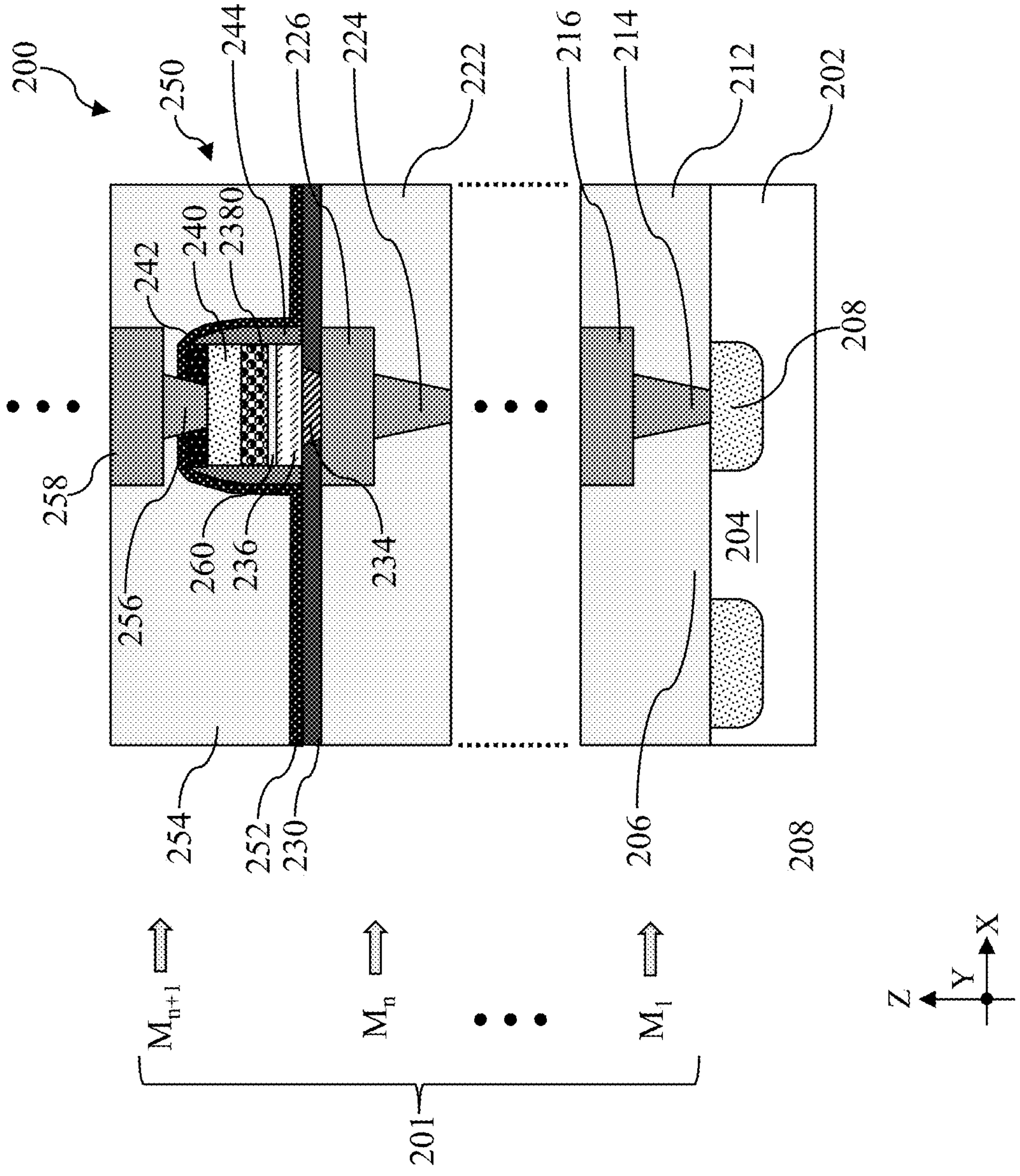
Figure 14:
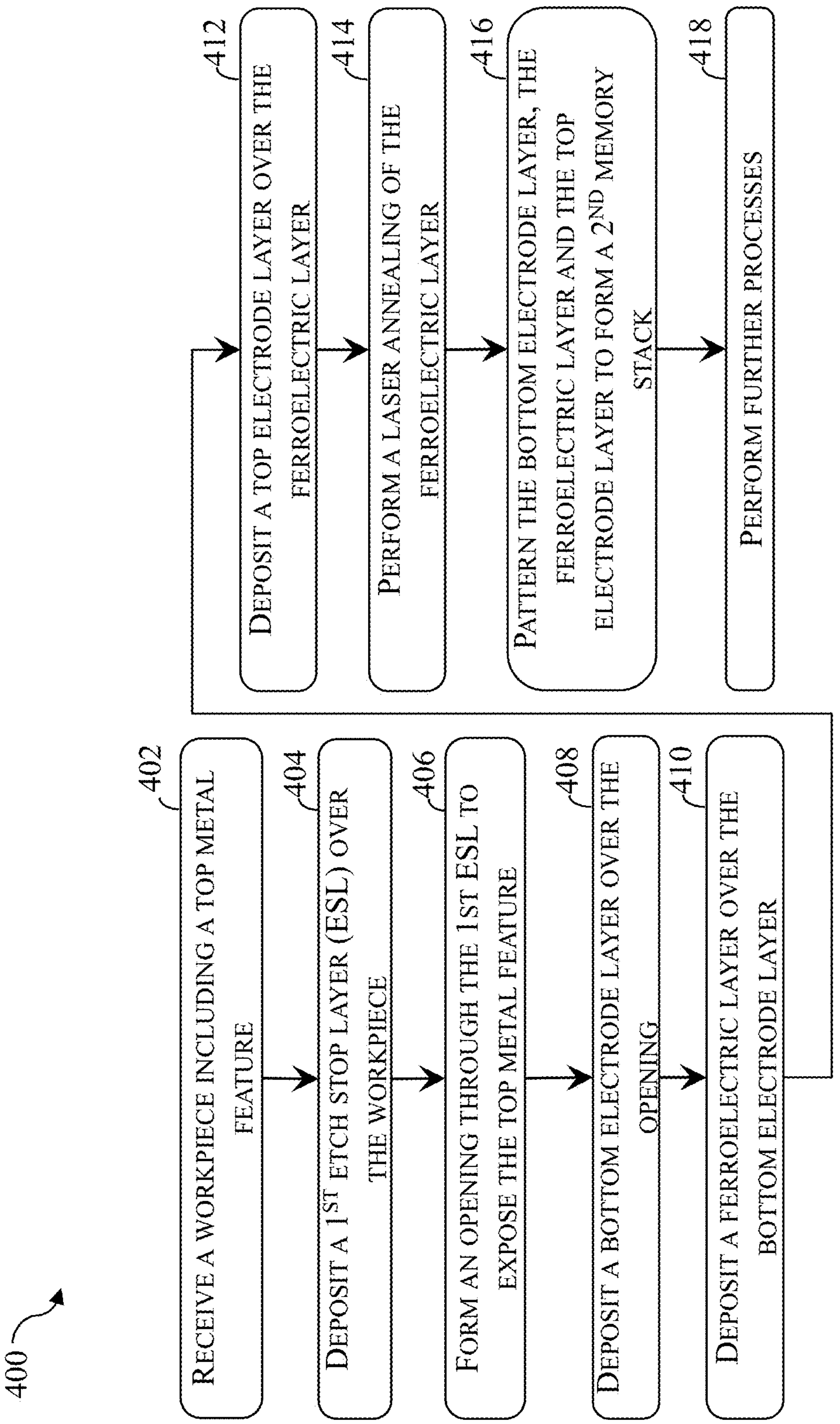
FIG. 14 is a flow chart illustrating an example method 400 of forming a device structure according to various aspects of the present disclosure.

Reference is now made to FIG. 13, which illustrates an alternative embodiment where an insulator layer 260 is deposited over the bottom electrode layer 236 before the deposition of the ferroelectric layer 238. The insulator layer 260 functions to create an imbalance on different sides of the ferroelectric layer 2380. Researches have indicated that by introducing a thin insulator layer on one side (such as the bottom side shown in FIG. 13), the On-state resistance and Off-state resistance of the first memory stack 250 can be more discernible or detectable. That is, in some embodiments, the introduction of the insulator layer 260 may improve the signal-to-noise ratio (SNR) of the first memory stack 250. In some embodiments, the insulator layer 260 may include nickel oxide, hafnium oxide, zinc oxide, titanium oxide, silicon oxide, zirconium oxide, tungsten oxide, aluminum oxide, tantalum oxide, molybdenum oxide, or copper oxide and may be deposited using CVD or ALD. It is noted that while zinc oxide is mentioned as a candidate material for the top electrode layer 240 and the insulator layer 260, the zinc oxide for the top electrode layer 240 and the zinc oxide for the insulator layer 260 have different oxygen content. The zinc oxide used as the top electrode layer 240 has a smaller oxygen content that the zinc oxide used as the insulator layer 260. To ensure the insulator layer 260 functions to improve the SNR of the first memory stack 250, a composition of the insulator layer 260 is different from a composition of the ferroelectric layer 238. The insulator layer 260 may have a thickness between about 1 nm and about 10 nm. When the thickness is smaller than 1 nm, it does not improve the SNR of the first memory stack 250. When the thickness is greater than 10 nm, the insulator layer 260 may introduce too much resistance. In the method 100, the insulator layer 260 may be deposited at block 112 right before the deposition of the ferroelectric layer 238.

FIG. 14 illustrates the method 400 where no separate contact via is formed to physically couple the bottom electrode layer to the top metal line 226. As will be made apparent in the following description of the method 400, some of the operations of the method 400 are similar to corresponding operations of the method 100. For example, operations at block 402 may be similar to those at block 102, operations at block 404 may be similar to those at block 104, operations at block 406 may be similar to those at block 106, operations at block 414 may be similar to those at block 116, operations at block 416 may be similar to those at block 118, and operations at block 418 may be similar to those at block 120. Descriptions of these similar operations in the method 400 may cut short or even omitted for brevity.

Referring to FIGS. 14 and 2, method 400 includes a block 402 where a workpiece 200 is provided. As operations at block 402 are similar to those at block 102 of the method 100, detailed description of block 402 is omitted for brevity.

Referring to FIGS. 14 and 3, method 400 includes a block 404 where a first etch stop layer (ESL) 230 is deposited over the workpiece 200. As operations at block 404 are similar to those at block 104 of the method 100, detailed description of block 404 is omitted for brevity.

Referring to FIGS. 14 and 4, method 400 includes a block 406 where an opening 232 is formed through the first ESL 230 to expose the top metal line 226. As operations at block 406 are similar to those at block 106 of the method 100, detailed description of block 406 is omitted for brevity.

Figure 15:
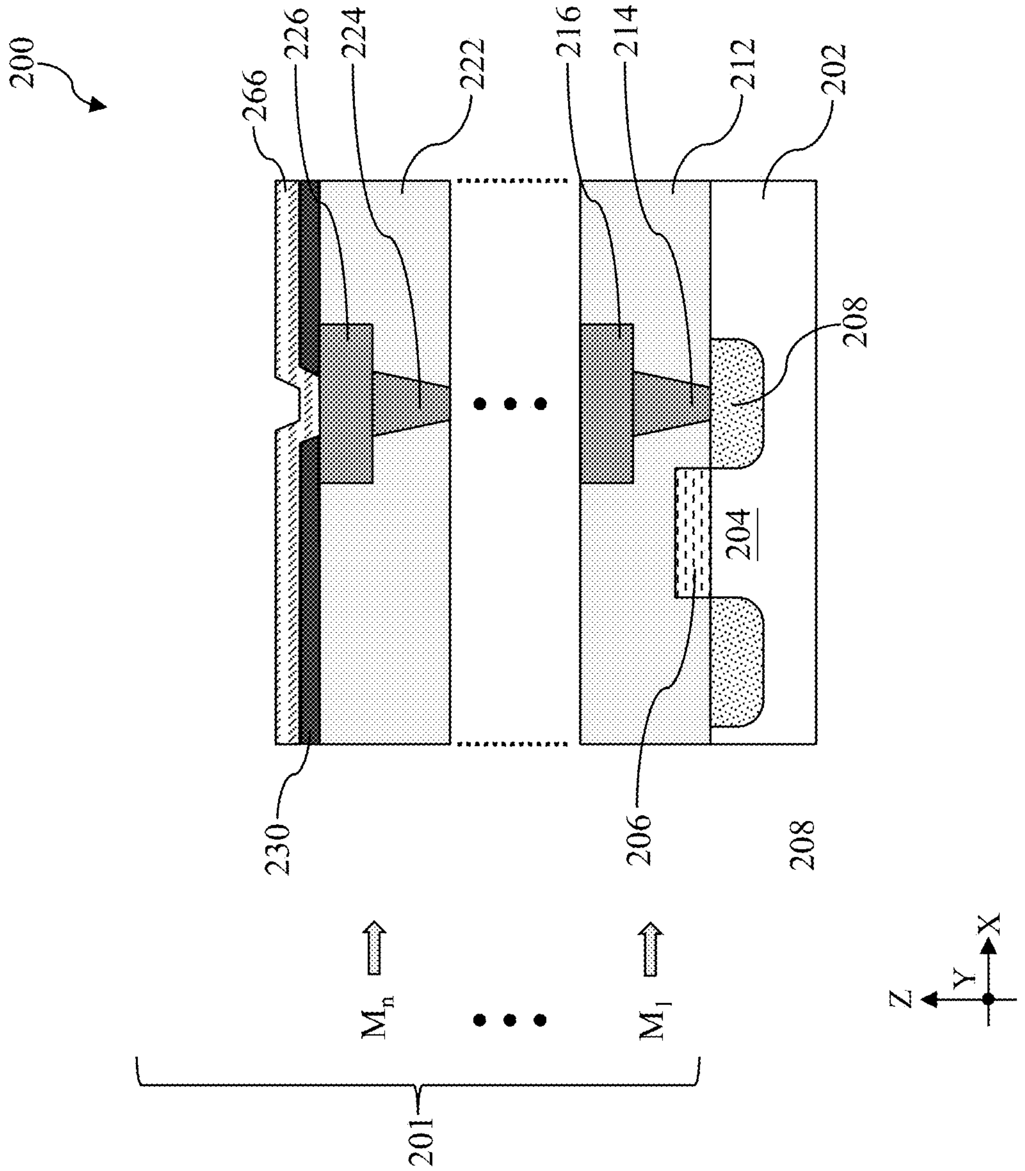
FIGS. 15-22 are fragmentary cross-sectional views of a workpiece undergoing operations of the method 400 in FIG. 14, according to various aspects of the present disclosure.

Referring to FIGS. 14 and 15, method 400 includes a block 408 where a bottom electrode layer 266 is deposited over the opening 232 and the first ESL 230. Operations at block 408 set the method 400 apart from the method 100 as the bottom electrode layer 266 is deposited over the workpiece 200 without first forming the contact via 234 (shown in FIG. 5). As shown in FIG. 15, the bottom electrode layer 266 is conformally deposited over the first ESL 230, the exposed top metal line 226, and the opening 232 such that the bottom electrode layer 266 physically contacts the exposed top surface of the top metal line 226. In some embodiments, the bottom electrode layer 266 includes tantalum nitride (TaN), titanium nitride (TiN), tantalum (Ta), tungsten (W), platinum (Pt), ruthenium (Ru), iridium (Ir), or molybdenum (Mo). It is noted that because the bottom electrode layer 266 does not function to allow transmission of laser radiation, it is not light-transmissive and is not formed of translucent or transparent metal oxide. In some instances, the bottom electrode layer 266 may have a thickness between about 10 nm and about 20 nm. This thickness range is not trivial. When the thickness is smaller than 10 nm, the bottom electrode layer 266 may become less conductive as the electrical conducting mechanism at that thickness. When the thickness is greater than 20 nm, the bottom electrode layer 266, which may be formed of less conductive material such as titanium nitride (TIN), may introduce too much resistance. Due to the conformal nature of the deposition of the bottom electrode layer 266, the bottom electrode layer 266 may include a ditch or a recess directly over the opening 232.

Figure 16:
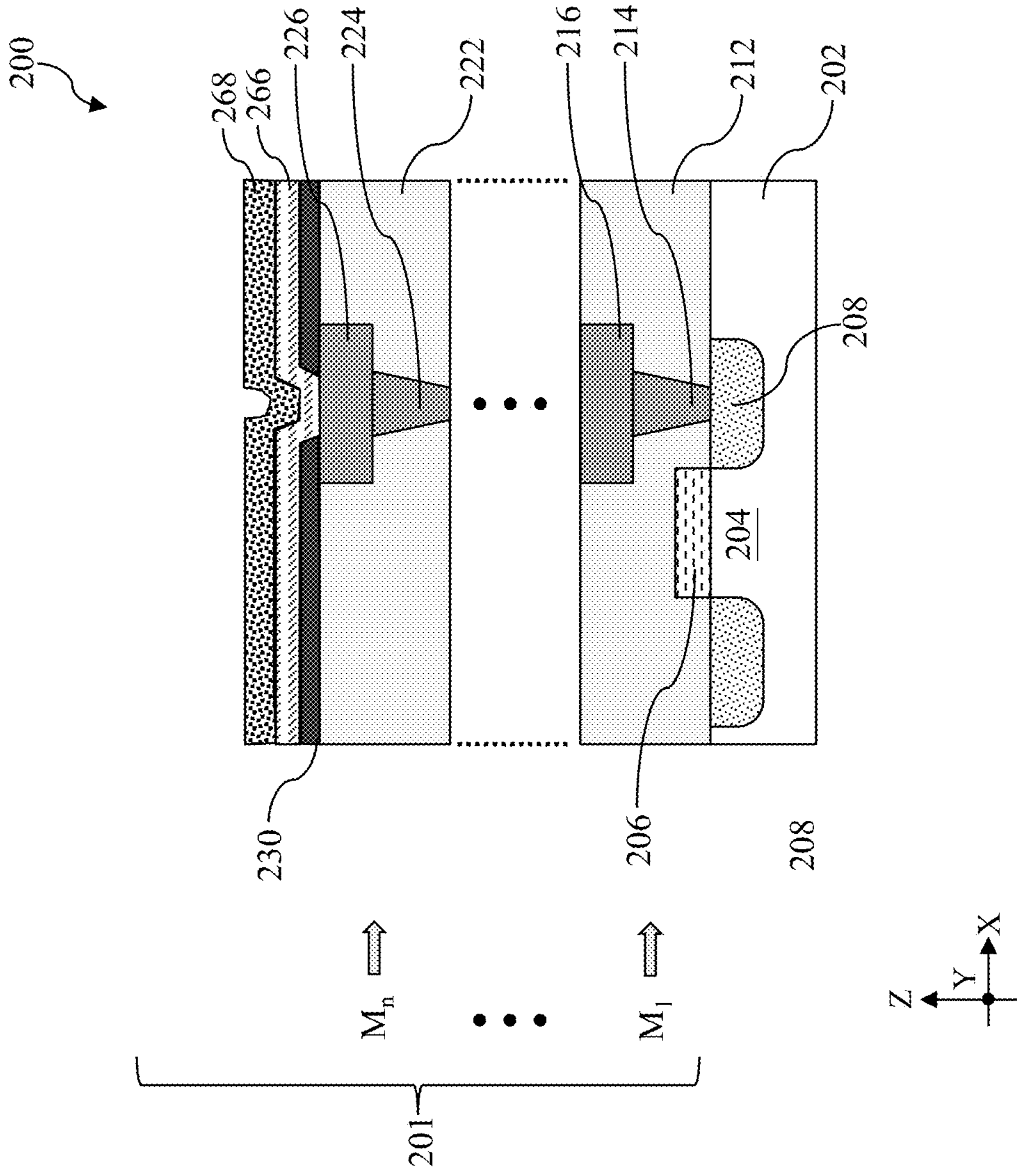

Referring to FIGS. 14 and 16, method 400 includes a block 410 where a ferroelectric layer 268 is deposited over the bottom electrode layer 266. The ferroelectric layer 268 may be a binary oxide, a ternary oxide, a ternary nitride, or a quaternary oxide that exhibits ferroelectricity. The ferroelectric layer 268 may be formed of hafnium oxide, hafnium silicate ($HfSiO_x$), hafnium zirconate ($HfZrO_x$), barium titanate ($BaTiO_3$), lead titanate ($PbTiO_3$), strontium titanate ($SrTiO_3$), calcium manganite ($CaMnO_3$), bismuth ferrite ($BiFeO_3$), aluminum scandium nitride (AlScN), aluminum gallium nitride (AlGaN), aluminum yttrium nitride (AlYN), doped $HfO_2$ (dopant: Si, Zr, Y, Al, Gd, Sr, La, Sc, Ge, etc.), lead zirconate titanate (PZT, $PbZr_xTi_yO_z$), barium strontium titanate ($BaSrTiO_x$), or strontium bismuth tantalate (SBT, $SrBi_2Ta_2O_9$). In one embodiment, the ferroelectric layer 268 includes zirconium-doped hafnium oxide or hafnium zirconium oxide (HZO). As shown in FIG. 16, the ferroelectric layer 268 may be conformally deposited over the workpiece 200, including over the bottom electrode layer 266 and the recess thereof, using PVD, CVD, or atomic layer deposition (ALD). It is noted that, as deposited at block 410, the ferroelectric layer 268 may not exhibit ferroelectricity (or at least sufficient ferroelectricity) as its deposition method may not provide it with sufficient crystallinity. In that sense, the ferroelectric layer 268 deposited at block 410 may be regarded as a ferroelectric precursor 268. As described above, the ferroelectric layer 268 is thin enough to allow quantum-mechanical tunneling. In some instances, the ferroelectric layer 268 may have a thickness between about 1 nm and about 10 nm. The thickness of the ferroelectric layer 268 is smaller than the thickness of the bottom electrode layer 266. Due to its conformal nature, the recess or ditch in the bottom electrode layer 266 may also transfer to the ferroelectric layer 268.

Figure 17:
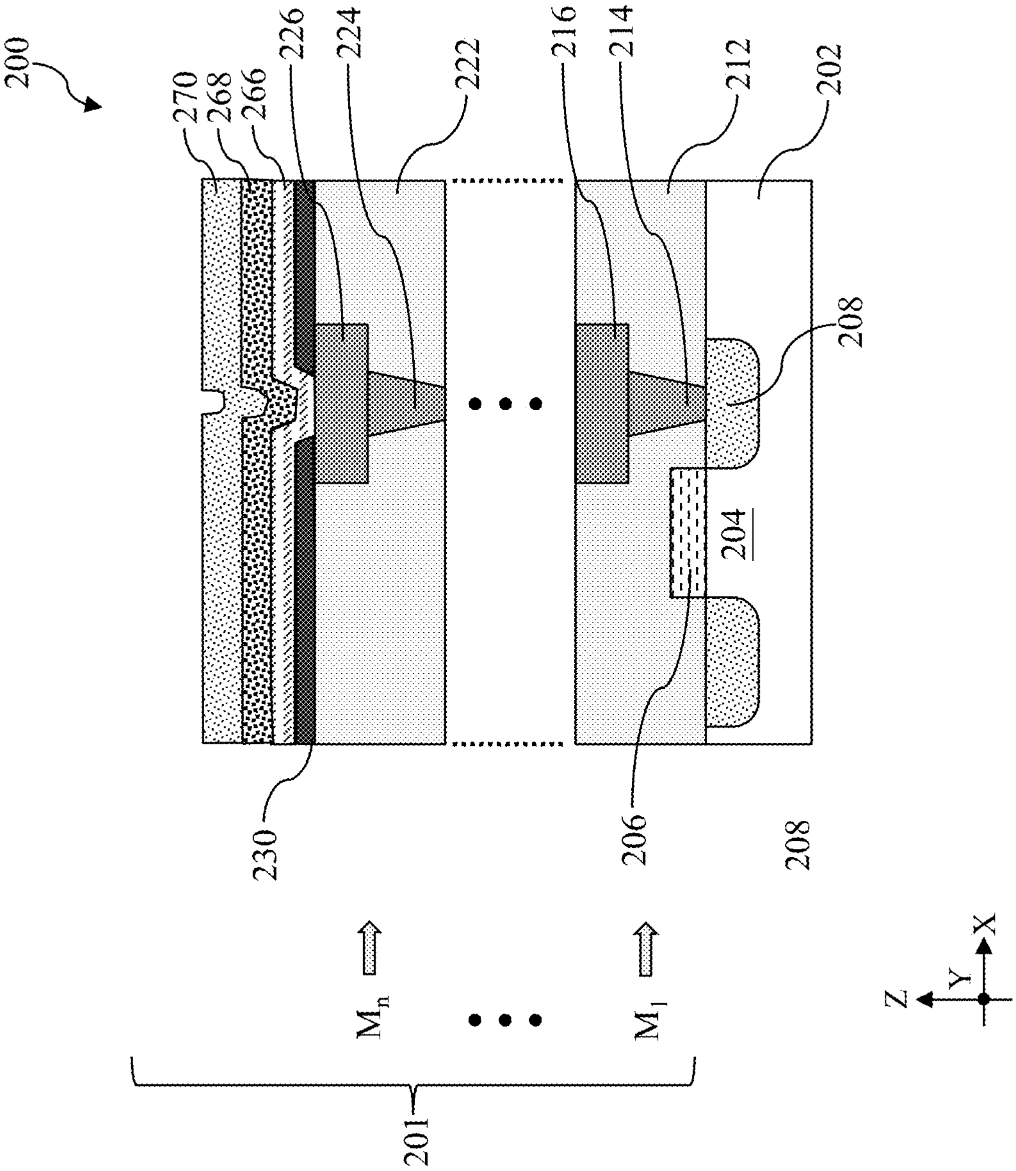

Referring to FIGS. 14 and 17, method 400 includes a block 412 where a top electrode layer 270 is deposited over the ferroelectric layer 268. The top electrode layer 270 is formed of a light-transmissive conductive material. In some embodiments, the top electrode layer 270 is formed of a conductive metal oxide such as indium-tin oxide (ITO), zinc oxide (ZnO), fluorine doped tin oxide (FTO), gallium zinc oxide (GZO), aluminum zinc oxide (AZO), antimony tin oxide (ATO). According to the present disclosure, the top electrode layer 270 is formed of a material that allows at least partial transmission of radiation of a laser source. In some instances, the rate of transmission for the top electrode layer 270 may be greater than 30% or the purposes of having a light-transmissive top electrode layer 270 would be defeated. That is, the top electrode layer 270 is translucent or transparent to radiation from such a laser source. As used herein, the laser source refers to a laser source for a laser annealing operation. Example laser sources include a helium-neon (He—Ne) laser source, a helium-neon (He—Ne) laser source, a Neodymium:Yttrium-Aluminum-Garnet (Nd:YAG) Laser source, an argon ion (Ar+) laser source, a continuous-wave (CW) argon laser source, a krypton ion (Kr+) laser source, a GaAs diode laser source, or a helium-cadmium (He—Cd) laser source. Because most of these example laser sources emit radiation in the visible light spectrum, the top electrode layer 270 can be said to be translucent or transparent to visible light. In some instances, the top electrode layer 270 may have a thickness between about 10 nm and about 20 nm. When the thickness is smaller than 10 nm, the top electrode layer 270 may become less conductive as the electrical conducting mechanism at that thickness. When the thickness is greater than 20 nm, the top electrode layer 270, which may be formed of less conductive metal oxides, may introduce too much resistance. While not explicitly illustrated in the figures, operations at block 412 may include a low-temperature anneal of the top electrode layer 270 to increase it light transmission and conductivity. In some instances, the lower temperature anneal may include use of an oven and an anneal temperature between 100° C. and about 200° C. The top electrode layer 270 may be conformally deposited over the ferroelectric layer 268 using PVD or CVD. Due to its conformal nature, the recess or ditch in the ferroelectric layer 268 may transfer to the top electrode layer 270.

Figure 18:
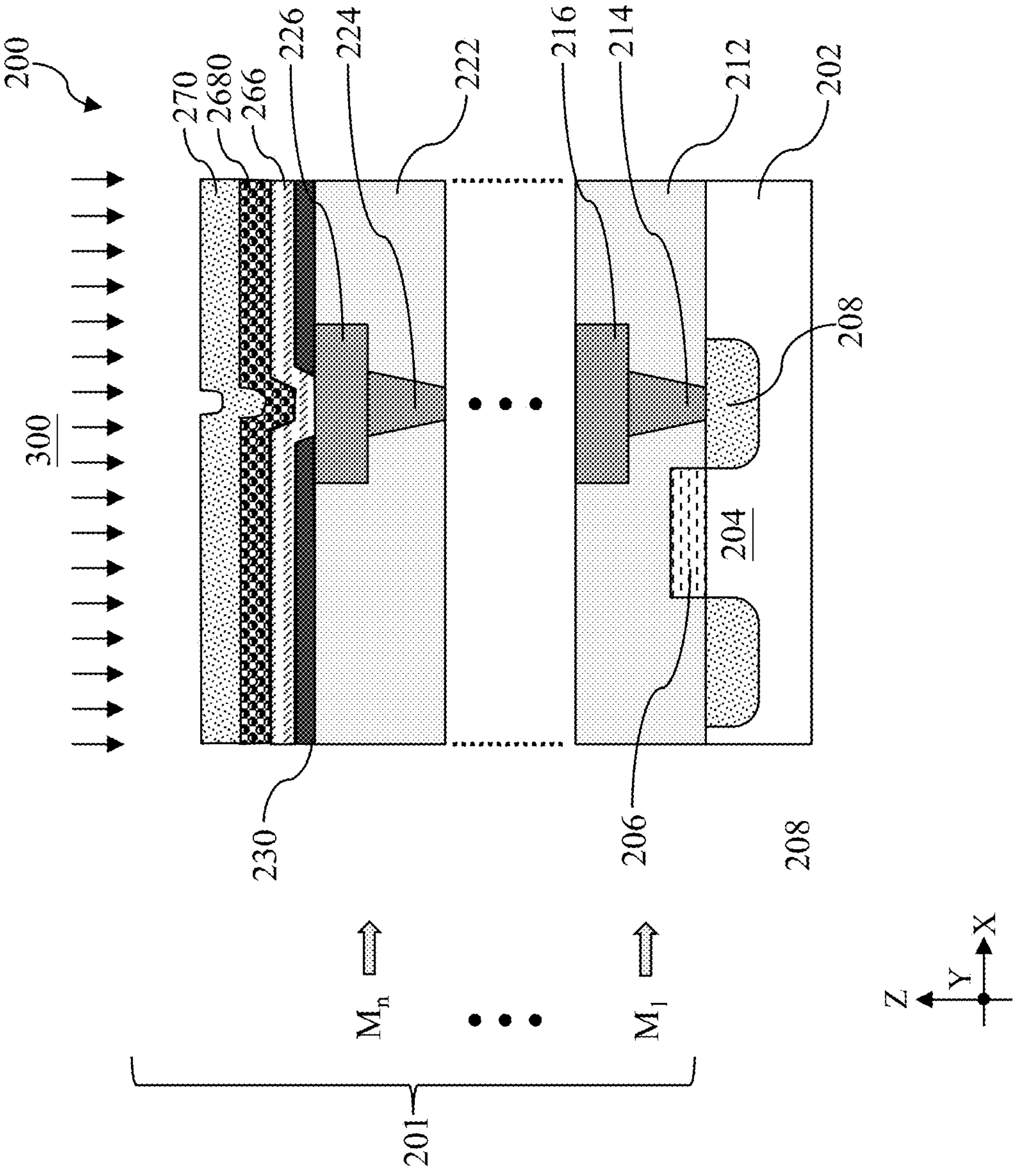

Referring to FIGS. 14 and 18, method 400 includes a block 414 where a laser anneal 300 is performed to the ferroelectric layer 268. As described above, the as-deposited ferroelectric layer 268 may not exhibit sufficient ferroelectricity due to lack of crystallinity. To increase the crystallization in the ferroelectric layer 268, the laser anneal 300 is performed at block 414. While the laser anneal 300 is shown in FIG. 18 as irradiating on the entire workpiece 200 at the same time, the laser anneal 300 may include scanning or stepping through substantially the entire top surface of the top electrode layer 270. As generally described above with respect to the operations at block 412, the top electrode layer 270 is translucent or transparent to radiation from the laser source used in laser annealing operations, such as the laser anneal 300 in FIG. 18. The radiation from the laser anneal 300 may then at least partially transmit through an entire thickness of the top electrode layer 270 and effectively reach the ferroelectric layer 268 below. The radiation, however, is blocked by the underlying layers (such as the bottom electrode layer 266 or the first ESL 230) and does not reach the FEOL structures, such as the device 20. That is, by having the light-transmissive top electrode layer 270 over the ferroelectric layer 268, the laser anneal 300 can effectively anneal the ferroelectric layer 268 to promote crystallization and ferroelectricity without much risk of damaging the FEOL structures. In some embodiments, the laser anneal 300 includes use of a helium-neon (He—Ne) laser source, a helium-neon (He—Ne) laser source, a Neodymium:Yttrium-Aluminum-Garnet (Nd:YAG) Laser source, an argon ion (Ar+) laser source, a continuous-wave (CW) argon laser source, a krypton on (Kr+) laser source, a GaAs diode laser source, or a helium-cadmium i(He—Cd) laser source and may include an annealing temperature between about 400° C. and about 1000° C. This annealing temperature range is not trivial. When the annealing temperature is below 400° C., crystallization of the ferroelectric layer 268 happens slowly and the laser anneal 300 may not cause sufficient crystallization of the ferroelectric layer 268 to ensure ferroelectric property. When the annealing temperature is greater than 1000° C., the thermal energy may cause damages to the top metal line 226 or the top via 224. To demonstrate the effect of the laser anneal 300, the post-anneal ferroelectric layer 268 is relabeled as ferroelectric layer 2680. The ferroelectric layer 2680 shares the same composition with the ferroelectric layer 268 but is more crystallized to exhibit stronger ferroelectricity.

It is observed that the ferroelectric layer 268, when annealed without being subject to strain from the top electrode layer 270, does not form the phase that exhibits ferroelectricity. It can be seen that the top electrode layer 270, like the top electrode layer 240 described above, provide several functions. First, it serves as the top electrode of the memory stack. To serve that function, the top electrode layer 270 is electrically conductive. Second, the top electrode layer 270 exerts tensile stress on the ferroelectric layer 268 such that the ferroelectric layer 268 may crystallize in phases that exhibit ferroelectricity. In that regard, the top electrode layer 270 serves as a stress source or a straining layer. Third, the top electrode layer 240 of the present disclosure is translucent or transparent to radiation of the laser source used in the laser anneal 300.

Figure 19:
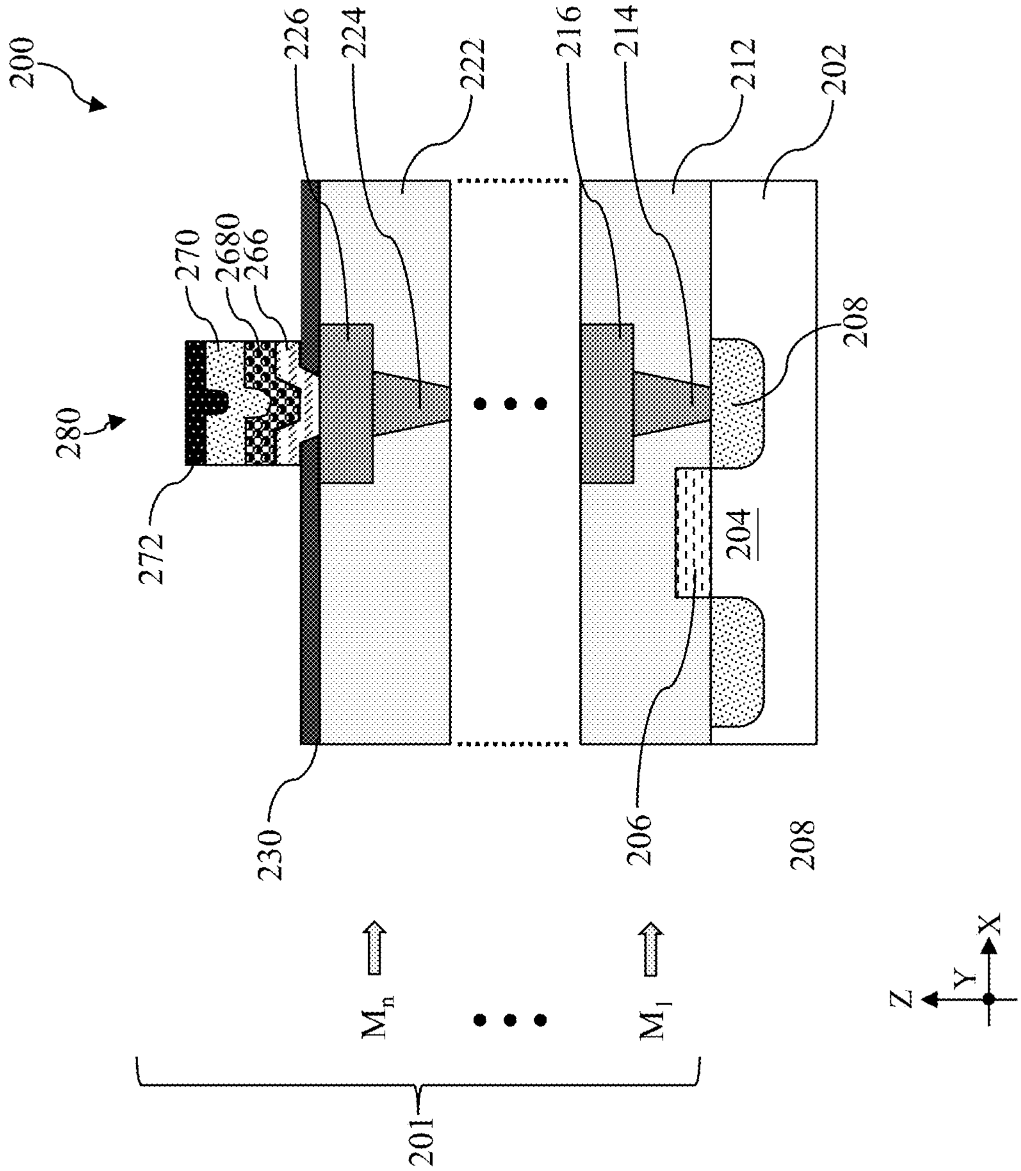

Referring to FIGS. 14 and 19, method 400 includes a block 416 where the bottom electrode layer 266, the ferroelectric layer 2680 and the top electrode layer 270 are patterned to form a second memory stack 280. After the laser anneal 300 of the ferroelectric layer 2680 through the top electrode layer 270 at block 414, a combination of photolithography processes and etching processes are performed to pattern the bottom electrode layer 266, the ferroelectric layer 2680 and the top electrode layer 270. In an example process, a hard mask layer 272 is blanketly deposited over the top electrode layer 270 using CVD. The hard mask layer 272 may include silicon oxide, silicon nitride, or silicon oxynitride. As shown in FIG. 19, in some embodiments, a portion of the hard mask layer 272 may partially extend into the recess or ditch in the top electrode layer 270. In some embodiments represented in FIG. 19, a top surface of the hard mask layer 272 may feature a recess or ditch as well. It is noted that a composition of the hard mask layer 272 is different from a composition of the first ESL 230. A photoresist layer is then deposited over the hard mask layer 272 using spin-on coating. The deposited photoresist layer may undergo a pre-exposure baking process, exposure to radiation reflected from or transmitted through a photomask, a post-exposure baking process, and developing process, so as to form a patterned photoresist. The hard mask layer 272 is then etched using the patterned photoresist as an etch mask to form a patterned hard mask layer 272. The patterned hard mask layer 272 is then applied as an etch mask to etch the bottom electrode layer 266, the ferroelectric layer 2680 and the top electrode layer 270 to form the second memory stack 280. Appropriate etch process at block 416 may be a dry etch process (e.g., a reactive ion etching (RIE) process) that includes use of an oxygen-containing gas (e.g., $O_2$), a fluorine-containing gas (e.g., $SF_6$ or $NF_3$), a chlorine-containing gas (e.g., $Cl_2$ and/or $BCl_3$), a bromine-containing gas (e.g., HBr), an iodine-containing gas, other suitable gases and/or plasmas, and/or combinations thereof. As shown in FIG. 19, the second memory stack 280 includes the bottom electrode layer 266, the ferroelectric layer 2680, the top electrode layer 270, and the patterned hard mask layer 272. Because the ferroelectric layer 2680 has a thickness to allow quantum-mechanical tunneling, the second memory stack 280 is an FTJ stack or an FTJ memory device. The second memory stack 280 is disposed directly over the exposed portion of the top metal line 226 such that the exposed top surface of the top metal line 226 physically contacts the bottom surface of the bottom electrode layer 266.

Figure 20:
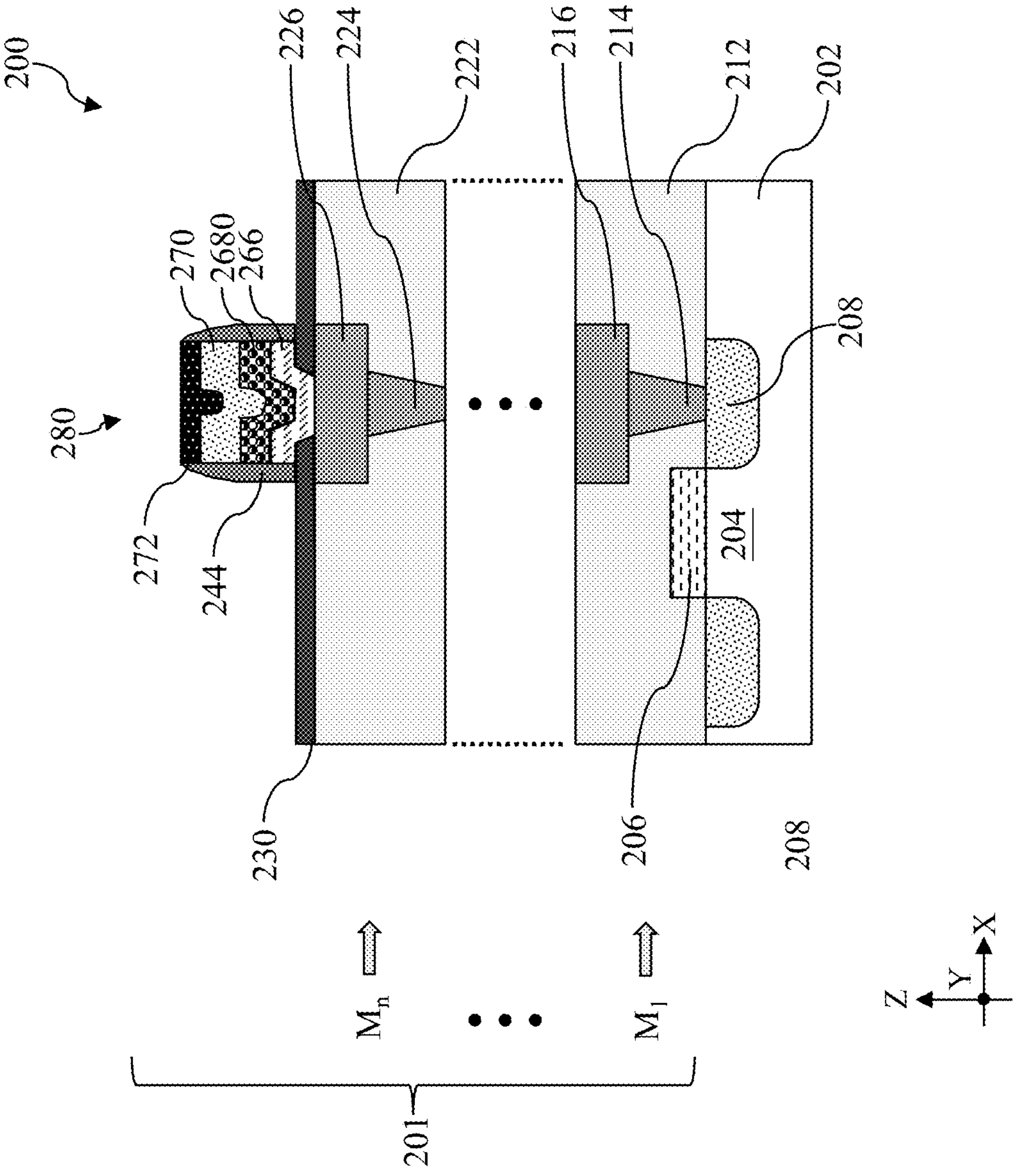
Figure 21:
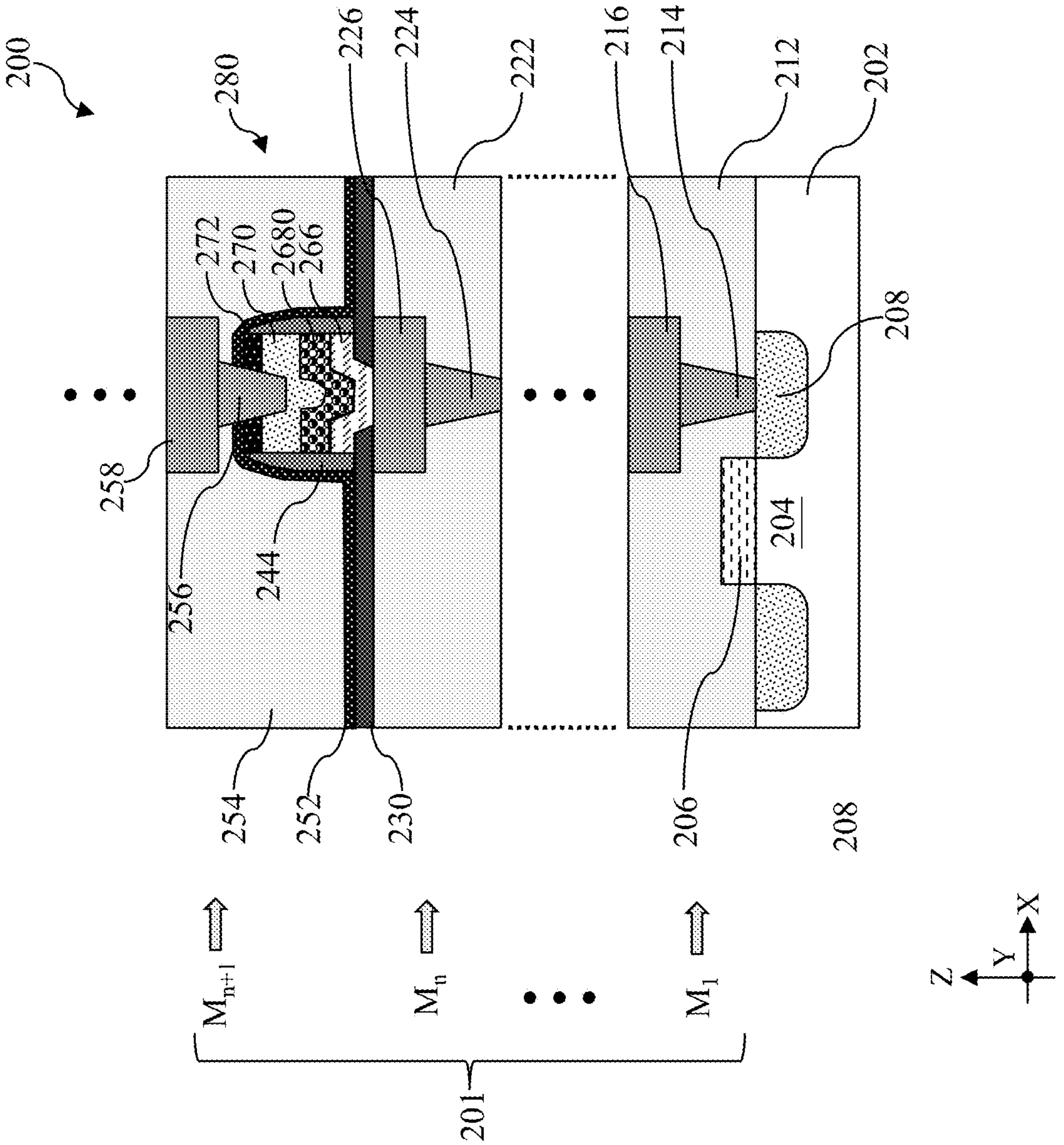

Referring to FIGS. 14, 20 and 21, method 400 includes a block 418 where further processes are performed. Such further processes at block 418 may include formation of a spacer 244 along sidewalls of the second memory stack 280 (shown in FIG. 20), deposition of a second ESL 252 over the second memory stack 280 and the spacer 244 (shown in FIG. 21), deposition of an (n+1)th IMD layer 254 over the second ESL 252 (shown in FIG. 21), and formation of an (n+1)th via 256 and an (n+1)th metal line 258 through the IMD layer 254 and the second ESL 252 (shown in FIG. 21). The spacer 244 shown in FIG. 20 may be formed by conformally depositing a spacer material layer over the workpiece 200, including over the second memory stack 280 and then anisotropically etching back the spacer material layer. As shown in FIG. 20, the spacer 244 only overs a portion of the first ESL 230 and a majority of the first ESL 230 is exposed after the formation of the spacer 244. In some embodiments, the spacer 244 may include silicon nitride. Then, referring to FIG. 21, the second ESL 252 is conformally deposited over the first ESL 230, the spacer 244 and the second memory stack 280. The second ESL 252 is formed from a different material than the first ESL 230. In some implementations, the second ESL 252 includes silicon nitride. This selection of material for the second ESL 252 is not trivial. Besides serving as an extra etch stop layer or protective layer in additional the patterned hard mask layer 272, the second ESL 252 functions to exert additional stress on the second memory stack 280, especially the ferroelectric layer 2680. In an example process, a second ESL 252, which is formed of silicon nitride, is conformally deposited over the second memory stack 280 and an anneal process with an anneal temperature between about 350° C. and about 400° C. is performed to introduce stress in the second ESL 252. The second ESL 252 exerts additional stress to stabilize the ferroelectricity in the ferroelectric layer 2680. It can yet again be seen that annealing alone does not by itself ensure ferroelectricity in the ferroelectric layer 2680.

After the deposition of the second ESL 252, the (n+1)th IMD layer 254 is deposited over the workpiece 200. The IMD layer 254 shares the same composition with the first IMD layer 212 and detailed description thereof is omitted for brevity. A dual damascene may then be performed to form the (n+1)th via 256 and the (n+1)th metal line 258 through the IMD layer 254 and the second ESL 252 such that the (n+1)th via 256 physically couples to the top electrode layer 270. In the depicted embodiments, the (n+1)th via 256 also extends through the patterned hard layer mask 272 and partially through the top electrode layer 270 to remove any of the patterned hard layer mask 272 vertically between the (n+1)th via 256 and the top electrode layer 270. The (n+1)th via 256 and the (n+1)th metal line 258 may be similar to the first via 214 and the first metal line 216 in terms of compositions and detailed descriptions thereof are omitted for brevity. It is noted that each of the vias and metal line may be a continuous structure as they are formed using a dual damascene process. The line between a via and an overlying metal line is shown only to facilitate the understanding. Although not explicitly shown in the figures, further metal layers (such as $M_{n+2}$, $M_{n+3}$, and so on), may be formed over the (n+1) metal layer to complete the interconnect structure 201.

Figure 22:
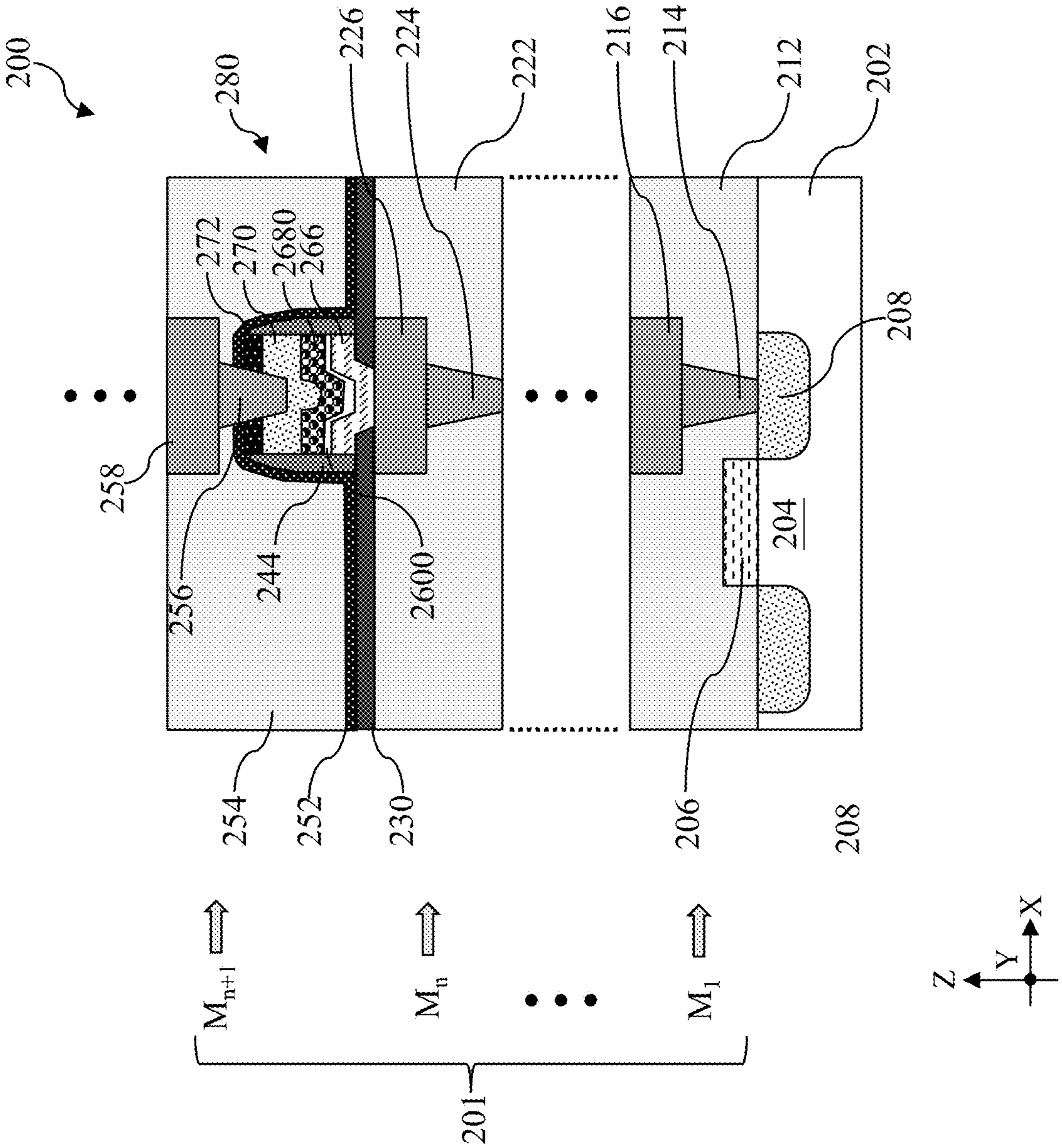

Reference is now made to FIG. 22, which illustrates an alternative embodiment where an insulator layer 2600 is deposited over the bottom electrode layer 266 before the deposition of the ferroelectric layer 268. The insulator layer 2600 functions to create an imbalance on different sides of the ferroelectric layer 2680. Researches have indicated that by introducing a thin insulator layer on one side (such as the bottom side shown in FIG. 22), the On-state resistance and Off-state resistance of the second memory stack 280 can be more discernible or detectable. That is, in some embodiments, the introduction of the insulator layer 2600 may improve the signal-to-noise ratio (SNR) of the second memory stack 280. In some embodiments, the insulator layer 2600 may include nickel oxide, hafnium oxide, zinc oxide, titanium oxide, silicon oxide, zirconium oxide, tungsten oxide, aluminum oxide, tantalum oxide, molybdenum oxide, or copper oxide and may be deposited using CVD or ALD. It is noted that while zinc oxide is mentioned as a candidate material for the top electrode layer 270 and the insulator layer 2600, the zinc oxide for the top electrode layer 240 and the zinc oxide for the insulator layer 2600 have different oxygen content. The zinc oxide used as the top electrode layer 270 has a smaller oxygen content that the zinc oxide used as the insulator layer 2600. To ensure the insulator layer 2600 functions to improve the SNR of the second memory stack 280, a composition of the insulator layer 2600 is different from a composition of the ferroelectric layer 268. The insulator layer 2600 may have a thickness between about 1 nm and about 10 nm. When the thickness is smaller than 1 nm, it does not improve the SNR of the second memory stack 280. When the thickness is greater than 10 nm, the insulator layer 2600 may introduce too much resistance. In the method 400, the insulator layer 2600 may be deposited at block 410 right before the deposition of the ferroelectric layer 268.

In one exemplary aspect, the present disclosure is directed to a device structure. The device structure includes a conductive feature disposed in a first dielectric layer, a ferroelectric tunnel junction (FTJ) stack disposed over the conductive feature, a spacer disposed along sidewalls of the FTJ stack, a second dielectric layer disposed over the spacer and the FTJ stack, and a contact via extending through the second dielectric layer and in contact with a top surface of the top electrode layer. The FTJ stack includes a bottom electrode layer electrically coupled to the conductive feature, a ferroelectric layer over the bottom electrode layer, and a top electrode layer on the ferroelectric layer. The top electrode layer is formed of a conductive metal oxide.

In some embodiments, the top electrode layer allows transmission of radiation from a helium-neon (He—Ne) laser source, a Neodymium:Yttrium-Aluminum-Garnet (Nd:YAG) Laser source, an argon ion (Ar+) laser source, a continuous-wave (CW) argon laser source, a krypton ion (Kr+) laser source, a GaAs diode laser source, or a helium-cadmium (He—Cd) laser source through an entire depth of the top electrode layer. The top electrode layer includes indium-tin oxide (ITO), zinc oxide (ZnO), fluorine doped tin oxide (FTO), gallium zinc oxide (GZO), aluminum zinc oxide (AZO), or antimony tin oxide (ATO). In some implementations, the ferroelectric layer includes hafnium oxide, hafnium silicate, hafnium zirconate, barium titanate, lead titanate, strontium titanate, calcium manganite, bismuth ferrite, aluminum scandium nitride, aluminum gallium nitride, aluminum yttrium nitride, lead zirconate titanate, barium strontium titanate, strontium bismuth tantalate. In some instances, a composition of the top electrode layer is different from a composition of the bottom electrode layer. In some embodiments, the bottom electrode layer includes tantalum nitride, titanium nitride, tantalum, tungsten, platinum, ruthenium, iridium, or molybdenum. In some implementations, the device structure may further include an etch stop layer over the conductive feature and the first dielectric layer. A portion of the bottom electrode layer extends completely through the etch stop layer. In some instances, a composition of the etch stop layer is different from a composition of the spacer. In some embodiments, the spacer includes silicon nitride and the etch stop layer includes silicon carbide.

In another exemplary aspect, the present disclosure is directed to a structure. The structure includes a conductive feature disposed in a first dielectric layer, an etch stop layer over the conductive feature and the first dielectric layer, a bottom contact via extending through the etch stop layer to contact the conductive feature, and a memory stack disposed on the etch stop layer and the bottom contact via. The memory stack includes a bottom electrode layer in contact with the bottom contact via, a ferroelectric layer over the bottom electrode layer, and a top electrode layer on the ferroelectric layer. The top electrode layer is formed of a conductive material that allows transmission of radiation from a helium-neon (He—Ne) laser source, a helium-neon (He—Ne) laser source, a Neodymium:Yttrium-Aluminum-Garnet (Nd:YAG) Laser source, an argon ion (Ar+) laser source, a continuous-wave (CW) argon laser source, a krypton ion (Kr+) laser source, a GaAs diode laser source, or a helium-cadmium (He—Cd) laser source through an entire depth of the top electrode layer.

In some embodiments, the top electrode layer includes indium-tin oxide (ITO), zinc oxide (ZnO), fluorine doped tin oxide (FTO), gallium zinc oxide (GZO), aluminum zinc oxide (AZO), or antimony tin oxide (ATO). In some implementations, a composition of the bottom electrode layer is different from a composition of the top electrode layer. In some embodiments, the structure may further include an insulator layer sandwiched between the bottom electrode layer and the ferroelectric layer. The insulator layer includes nickel oxide, titanium oxide, silicon oxide, zirconium oxide, tungsten oxide, aluminum oxide, tantalum oxide, molybdenum oxide, or copper oxide. In some instances, the top electrode layer includes a first thickness, the ferroelectric layer includes a second thickness, and the second thickness is smaller than the first thickness.

In yet another exemplary aspect, the present disclosure is directed to a method. The method includes providing a workpiece including a conductive feature disposed in a first dielectric layer, depositing an etch stop layer over the workpiece, forming a contact via through the etch stop layer to contact the conductive feature, depositing a bottom electrode layer over the etch stop layer and the contact via, depositing a ferroelectric layer over the bottom electrode layer, depositing a top electrode layer over the ferroelectric layer, after the depositing of the top electrode layer, per-forming a laser annealing process using a laser source to promote crystallization of the ferroelectric layer, and after the laser annealing process, patterning the bottom electrode layer, the ferroelectric layer, and the top electrode layer to form a memory stack. The top electrode layer is formed of a conductive material that allows transmission of radiation from the laser source.

In some embodiments, the laser annealing process includes a temperature between about 400° C. and about 1000° C. In some embodiments, the laser source includes a helium-neon (He—Ne) laser source, a helium-neon (He—Ne) laser source, a Neodymium:Yttrium-Aluminum-Garnet (Nd:YAG) Laser source, an argon ion (Ar+) laser source, a continuous-wave (CW) argon laser source, a krypton ion (Kr+) laser source, a GaAs diode laser source, or a helium-cadmium (He—Cd) laser source. In some embodiments, the top electrode layer includes a conductive metal oxide. In some implementations, the top electrode layer includes indium-tin oxide (ITO), zinc oxide (ZnO), fluorine doped tin oxide (FTO), gallium zinc oxide (GZO), aluminum zinc oxide (AZO), or antimony tin oxide (ATO). In some instances, the ferroelectric layer includes a first depth between about 1 nm and about 10 nm and the top electrode layer includes a second depth between about 10 nm and about 20 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device structure, comprising:
- a conductive feature disposed in a first dielectric layer;
- an etch stop layer over the conductive feature and the first dielectric layer;
- a ferroelectric tunnel junction (FTJ) stack disposed over the conductive feature, the FTJ stack comprising:
  - a bottom electrode layer electrically coupled to the conductive feature,
  - a ferroelectric layer over the bottom electrode layer, and
  - a top electrode layer on the ferroelectric layer;
- a hard mask layer over the top electrode layer;
- a spacer disposed along and interfacing sidewalls of the FTJ stack and sidewalls of the hard mask layer;
- a second dielectric layer disposed over the spacer and the FTJ stack; and
- a contact via extending through the second dielectric layer and the hard mask layer to contact a top surface of the top electrode layer,
- wherein the top electrode layer is formed of a conductive metal oxide,
- wherein a portion of the bottom electrode layer extends completely through the etch stop layer to form a recess,
- wherein the ferroelectric layer extends into the recess in the bottom electrode layer.

2. The device structure of claim 1, wherein the top electrode layer allows transmission of radiation from a helium-neon (He-Ne) laser source, a Neodymium: Yttrium-Aluminum-Garnet (Nd: YAG) laser source, an argon ion (Ar+) laser source, a continuous-wave (CW) argon laser source, a krypton ion (Kr+) laser source, a GaAs diode laser source, or a helium-cadmium (He-Cd) laser source through an entire depth of the top electrode layer.

3. The device structure of claim 1, wherein the top electrode layer comprises indium-tin oxide (ITO), zinc oxide (ZnO), fluorine doped tin oxide (FTO), gallium zinc oxide (GZO), aluminum zinc oxide (AZO), or antimony tin oxide (ATO).

4. The device structure of claim 1, wherein the ferroelectric layer comprises hafnium oxide, hafnium silicate, hafnium zirconate, barium titanate, lead titanate, strontium titanate, calcium manganite, bismuth ferrite, aluminum scandium nitride, aluminum gallium nitride, aluminum yttrium nitride, lead zirconate titanate, barium strontium titanate, strontium bismuth tantalate.

5. The device structure of claim 1, wherein a composition of the top electrode layer is different from a composition of the bottom electrode layer.

6. The device structure of claim 1, wherein the bottom electrode layer comprises tantalum nitride, titanium nitride, tantalum, tungsten, platinum, ruthenium, iridium, or molybdenum.

7. The device structure of claim 1, wherein a composition of the etch stop layer is different from a composition of the spacer.

8. The device structure of claim 7,
- wherein the spacer comprises silicon nitride,
- wherein the etch stop layer comprises silicon carbide.

9. The device structure of claim 1, wherein a portion of the ferroelectric layer extends into the bottom electrode layer.

10. A structure, comprising:
- a conductive feature disposed in a first dielectric layer;
- an etch stop layer over the conductive feature and the first dielectric layer;
- a stack disposed over the conductive feature, the stack comprising:
  - a bottom electrode layer electrically coupled to the conductive feature,
  - a ferroelectric layer over the bottom electrode layer, and
  - a top electrode layer on the ferroelectric layer;
- a hard mask layer over the top electrode layer;
- a spacer disposed along and interfacing sidewalls of the stack and sidewalls of the hard mask layer;
- a second dielectric layer disposed over the spacer and the stack; and
- a contact via extending through the second dielectric layer and the hard mask layer to contact a top surface of the top electrode layer,
- wherein the top electrode layer is formed of a conductive metal oxide that allows transmission of radiation from a helium-neon (He-Ne) laser source, a Neodymium: Yttrium-Aluminum-Garnet (Nd: YAG) laser source, an argon ion (Ar+) laser source, a continuous-wave (CW) argon laser source, a krypton ion (Kr+) laser source, a GaAs diode laser source, or a helium-cadmium (He-Cd) laser source through an entire depth of the top electrode layer,
- wherein a portion of the bottom electrode layer extends through the etch stop layer to form a recess,
- wherein the ferroelectric layer extends into the recess in the bottom electrode layer.

11. The structure of claim 10, wherein the top electrode layer compri1ses indium-tin oxide (ITO), zinc oxide (ZnO), fluorine doped tin oxide (FTO), gallium zinc oxide (GZO), aluminum zinc oxide (AZO), or antimony tin oxide (ATO).

12. The structure of claim 10, wherein a composition of the bottom electrode layer is different from a composition of the top electrode layer.

13. The structure of claim 10, wherein the bottom electrode layer comprises tantalum nitride, titanium nitride, tantalum, tungsten, platinum, ruthenium, iridium, or molybdenum.

14. The structure of claim 10, further comprising:

an insulator layer sandwiched between the bottom electrode layer and the ferroelectric layer, wherein the insulator layer comprises nickel oxide, titanium oxide, silicon oxide, zirconium oxide, tungsten oxide, aluminum oxide, tantalum oxide, molybdenum oxide, or copper oxide.

15. The structure of claim 10, wherein the top electrode layer comprises a first thickness, wherein the ferroelectric layer comprises a second thickness, wherein the second thickness is smaller than the first thickness.

16. The structure of claim 15, wherein the first thickness is between about 10 nm and about 20 nm.

17. A structure, comprising:

a conductive feature disposed in a first dielectric layer;

an etch stop layer disposed over the conductive feature and the first dielectric layer;

a stack disposed over the conductive feature, the stack comprising:

a bottom electrode layer electrically coupled to the conductive feature, a ferroelectric layer over the bottom electrode layer, and a top electrode layer on the ferroelectric layer;

a hard mask layer over the top electrode layer;

a spacer disposed along and interfacing sidewalls of the stack and sidewalls of the hard mask layer;

a second dielectric layer disposed over the spacer and the stack; and a contact via extending through the second dielectric layer and the hard mask layer to contact a top surface of the top electrode layer, wherein the top electrode layer is formed of a conductive metal oxide that allows transmission of visible light, wherein a portion of the bottom electrode layer extends through the etch stop layer to form a recess, wherein the ferroelectric layer extends into the recess in the bottom electrode layer.

18. The structure of claim 17, wherein the top electrode layer comprises indium-tin oxide (ITO), zinc oxide (ZnO), fluorine doped tin oxide (FTO), gallium zinc oxide (GZO), aluminum zinc oxide (AZO), or antimony tin oxide (ATO).

19. The structure of claim 17, wherein a composition of the bottom electrode layer is different from a composition of the top electrode layer.

20. The structure of claim 17, wherein the bottom electrode layer comprises metal or metal nitride.

* * * * *